United States Patent
Jeon et al.

(10) Patent No.: US 12,356,807 B2
(45) Date of Patent: Jul. 8, 2025

(54) DISPLAY DEVICE AND LIGHT TRANSMISSIVE DEVICE

(71) Applicant: Samsung Display Co., Ltd., Yongin-si (KR)

(72) Inventors: Woosik Jeon, Yongin-si (KR); Eonseok Oh, Yongin-si (KR); Hanggochnuri Jo, Yongin-si (KR); Sangyeol Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 38 days.

(21) Appl. No.: 16/842,313

(22) Filed: Apr. 7, 2020

(65) Prior Publication Data
US 2020/0365674 A1 Nov. 19, 2020

(30) Foreign Application Priority Data
May 13, 2019 (KR) .......................... 10-2019-0055834

(51) Int. Cl.
*H01L 27/32* (2006.01)
*H01L 27/12* (2006.01)
(Continued)

(52) U.S. Cl.
CPC ......... *H10K 59/126* (2023.02); *H10K 59/124* (2023.02); *H10K 59/1315* (2023.02); *H10K 59/40* (2023.02)

(58) Field of Classification Search
CPC ............ H01L 27/3276; H01L 27/3246; H01L 27/3279; H01L 27/3297; H01L 27/32; H01L 27/3202; H01L 51/5212; H01L 51/5228; H10K 59/131; H10K 59/124; H10K 59/122; H10K 59/8731; H10K 59/1213; H10K 50/844; H10K 59/40; H10K 59/123; H10K 59/12; H10K 59/121; H10K 59/873; H10K 77/111; H10K 59/1216;
(Continued)

(56) References Cited

U.S. PATENT DOCUMENTS 9,385,331 B2 7/2016 Jang
9,818,814 B2 * 11/2017 Park ................... H10K 59/1315
(Continued)

FOREIGN PATENT DOCUMENTS

CN 107870689 A 4/2018
CN 111446272 A 7/2020
(Continued)

*Primary Examiner* — Mary A Wilczewski
*Assistant Examiner* — Tsz K Chiu
(74) *Attorney, Agent, or Firm* — Womble Bond Dickinson (US) LLP

(57) ABSTRACT

A display device includes: a substrate on which a pixel and a transmissive area are located, the pixel including a display element; a plurality of wirings on the substrate, the wirings being on one side of the transmissive area; a pixel electrode and an emission layer each included in the pixel; an opposite electrode on the emission layer and including an opening corresponding to the transmissive area; and a first metal layer overlapping the wirings, the first metal layer being below the wirings, wherein a lateral surface of the first metal layer has an inverse-tapered shape with respect to a top surface of the substrate.

10 Claims, 14 Drawing Sheets

(51) Int. Cl.
H01L 51/52 (2006.01)
H10K 59/124 (2023.01)
H10K 59/126 (2023.01)
H10K 59/131 (2023.01)
H10K 59/40 (2023.01)

(58) Field of Classification Search
CPC .......... H10K 59/8722; H10K 59/1201; H10K 71/00; H10K 59/126; H10K 59/1315; H10K 2102/311; H10K 50/84; H10K 59/65; H10K 59/8792; H10K 59/87; H10K 2102/351; H10K 50/8426; H10K 59/38; H10K 77/10; H10K 2102/00; H10K 59/353; H10K 59/88; H10K 50/8445; H10K 59/352; H10K 50/865; H10K 59/35; H10K 50/15; H10K 59/60; H10K 59/8791; H10K 50/80; H10K 59/00; H10K 59/879; H10K 50/16; H10K 50/824; H10K 59/80515; H10K 59/8052; H10K 59/80521; H10K 50/17; H10K 50/805; H10K 50/86; H10K 59/8723; H10K 50/82; H10K 59/8051; H10K 59/871; H10K 71/60; H10K 50/171; H10K 50/81; H10K 50/822; H10K 50/841; H10K 50/858; H10K 50/868; H10K 50/11; H10K 59/80522; H10K 50/813; H10K 71/221; H10K 2102/302; H10K 2102/341; H10K 50/818; H10K 59/351; H10K 59/50; H10K 59/80; H10K 59/876; H10K 59/878; H10K 77/00; H10K 2102/331; H10K 50/00; H10K 50/856; H10K 59/179; H10K 59/805; H10K 2102/103; H10K 50/828; H10K 50/854; H10K 59/10; H10K 59/127; H10K 71/421; H10K 71/80; H10K 2102/101; H10K 50/8428; H10K 50/85; H10K 50/87; H10K 59/1275; H10K 59/128; H10K 59/30; H10K 59/80524; H10K 59/82; H10K 59/872; H10K 71/10; H10K 71/621; H10K 71/70; H10K 10/478; H10K 10/88; H10K 2101/80; H10K 2102/301; H10K 2102/3023; H10K 2102/3026; H10K 2102/3031; H10K 50/13; H10K 50/14; H10K 50/157; H10K 50/816; H10K 50/8423; H10K 50/852; H10K 50/88; H10K 59/125; H10K 59/18; H10K 59/19; H10K 59/70; H10K 59/80518; H10K 59/877; H10K 59/8793; H10K 59/8794; H10K 59/90; H10K 71/16; H10K 71/851

See application file for complete search history.

(56) References Cited

U.S. PATENT DOCUMENTS

| | | | |
|---|---|---|---|
| 10,050,097 B2 | 8/2018 | Oh et al. | |
| 10,381,485 B2 | 8/2019 | Kang et al. | |
| 11,424,306 B2* | 8/2022 | Jeon | H10K 71/421 |
| 11,450,718 B2* | 9/2022 | Jo | H10K 71/221 |
| 11,521,545 B2* | 12/2022 | Cho | G09G 3/3225 |
| 11,574,966 B2* | 2/2023 | Bae | H10K 50/858 |
| 11,737,319 B2* | 8/2023 | Bae | H10K 59/126 257/40 |
| 2012/0080680 A1* | 4/2012 | Choi | H10K 59/121 257/E33.003 |
| 2012/0146030 A1* | 6/2012 | You | H10K 59/1315 257/E29.273 |
| 2012/0267611 A1* | 10/2012 | Chung | H10K 50/818 257/E27.118 |
| 2014/0354142 A1* | 12/2014 | Jeong | H01L 27/3246 313/506 |
| 2015/0123107 A1* | 5/2015 | Choi | G09G 3/3233 438/23 |
| 2016/0126494 A1* | 5/2016 | Jung | H10K 50/86 438/23 |
| 2016/0155790 A1* | 6/2016 | Lee | H01L 51/56 438/34 |
| 2016/0351639 A1* | 12/2016 | Jeong | H01L 51/0023 |
| 2017/0162637 A1* | 6/2017 | Choi | G09G 3/3225 |
| 2017/0186831 A1* | 6/2017 | Nam | H01L 27/3272 |
| 2017/0278909 A1 | 9/2017 | Jeon et al. | |
| 2017/0288003 A1 | 10/2017 | Kim et al. | |
| 2017/0373130 A1* | 12/2017 | Lee | H01L 51/5212 |
| 2018/0040682 A1 | 2/2018 | Ebisuno et al. | |
| 2018/0089485 A1 | 3/2018 | Bok | |
| 2018/0122882 A1* | 5/2018 | Lee | H01L 27/1248 |
| 2018/0123078 A1* | 5/2018 | Byun | H01L 27/3246 |
| 2018/0180931 A1 | 6/2018 | Shen et al. | |
| 2018/0240822 A1* | 8/2018 | Lee | H01L 27/3272 |
| 2020/0227494 A1 | 7/2020 | Bae et al. | |
| 2021/0280658 A1* | 9/2021 | Chae | H10K 59/131 |
| 2021/0335955 A1* | 10/2021 | Son | H10K 50/844 |
| 2021/0359073 A1* | 11/2021 | Cha | H10K 59/131 |
| 2021/0391400 A1* | 12/2021 | Kim | H10K 59/121 |

FOREIGN PATENT DOCUMENTS

| | | | | |
|---|---|---|---|---|
| EP | 3276668 A1 | | 1/2018 | |
| EP | 3660906 A1 | * | 6/2020 | ......... H01L 27/3276 |
| KR | 10-2014-0011793 A | | 1/2014 | |
| KR | 10-2017-0049705 A | | 5/2017 | |
| KR | 10-2017-0078075 A | | 7/2017 | |
| KR | 10-2017-0080251 A | | 7/2017 | |
| KR | 10-2018-0017280 A | | 2/2018 | |
| KR | 10-2018-0047589 A | | 5/2018 | |
| KR | 10-2018-0088099 A | | 8/2018 | |

* cited by examiner

DISPLAY DEVICE AND LIGHT TRANSMISSIVE DEVICE

CROSS-REFERENCE TO RELATED APPLICATION

The present application claims priority to and the benefit of Korean Patent Application No. 10-2019-0055834, filed on May 13, 2019, in the Korean Intellectual Property Office, the disclosure of which is incorporated herein in its entirety by reference.

BACKGROUND

1. Field

Aspects of one or more embodiments relate to a display device.

2. Description of the Related Art

Recently, the purposes of a display device have become more diversified. Also, as display devices have become thinner and more lightweight, their range of use has gradually been extended.

As display device are utilized for various purposes, there may be various methods in designing the shape of a display device. Also, functions that may be combined or associated with a display device may be added.

The above information disclosed in this Background section is only for enhancement of understanding of the background and therefore the information discussed in this Background section does not necessarily constitute prior art.

SUMMARY

Aspects of one or more embodiments include a display device including a sensor area inside a display area, with a sensor being arranged in the sensor area. However, it should be understood that example embodiments described herein should be considered in a descriptive sense only and not for limitation of the disclosure.

Additional aspects will be set forth in part in the description which follows and, in part, will be more apparent from the description, or may be learned by practice of the presented example embodiments.

According to one or more example embodiments, a display device includes: a substrate in which a pixel and a transmissive area are arranged, the pixel including a display element; wirings on the substrate, the wirings being arranged on one side of the transmissive area; a pixel electrode and an emission layer each included in the pixel; an opposite electrode arranged on the emission layer and including an opening corresponding to the transmissive area; and a first metal layer overlapping the wirings, the first metal layer being below the wirings, wherein a lateral surface of the first metal layer has an inverse-tapered shape with respect to a top surface of the substrate.

According to some example embodiments, the display device may further include: a buffer layer arranged over the substrate, wherein the pixel may include a thin film transistor arranged on the buffer layer, and the first metal layer may be arranged between the substrate and the buffer layer.

According to some example embodiments, the substrate may include a first base layer, a first inorganic layer, a second base layer, and a second inorganic layer that are sequentially stacked.

According to some example embodiments, the first metal layer may be arranged under the first base layer, between the first base layer and the first inorganic layer, between the first inorganic layer and the second base layer, between the second base layer and the second inorganic layer, or on the second inorganic layer.

According to some example embodiments, the display device may further include: a first additional metal layer overlapping the first metal layer with an insulating layer therebetween, wherein the first additional metal layer may be arranged under the first base layer, between the first base layer and the first inorganic layer, between the first inorganic layer and the second base layer, between the second base layer and the second inorganic layer, or on the second inorganic layer.

According to some example embodiments, the wirings may include a first wiring and a second wiring that do not overlap each other, and the first metal layer may include a first sub-metal layer and a second sub-metal layer, the first sub-metal layer overlapping the first wiring, and the second sub-metal layer overlapping the second wiring.

According to some example embodiments, the display device may further include: a second metal layer arranged below the pixel.

According to some example embodiments, a lateral surface of the second metal layer may have an inverse-tapered shape.

According to some example embodiments, the display device may further include: a functional layer arranged between the pixel electrode and the emission layer, or between the emission layer and the opposite electrode, wherein the same material as that of the functional layer may be arranged in the transmissive area.

According to some example embodiments, the display device may further include: an inorganic insulating layer arranged over the substrate, wherein the inorganic insulating layer may include a first hole corresponding to the transmissive area, and the opposite electrode may be arranged on a lateral wall of the first hole.

According to one or more example embodiments, a display device includes: a substrate including a display area and a sensor area, the display area including a main pixel, and the sensor area including an auxiliary pixel and a transmissive area; a first pixel electrode and a first emission layer included in the main pixel; a second pixel electrode and a second emission layer included in the auxiliary pixel; an opposite electrode arranged as one body over the display area and the sensor area; a wiring arranged on one side of the transmissive area; and a first metal layer overlapping the wiring, the first metal layer being below the wiring.

According to some example embodiments, a lateral surface of the first metal layer may have an inverse-tapered shape with respect to a top surface of the substrate.

According to some example embodiments, the display device may further include: an inorganic insulating layer arranged on the substrate, wherein the inorganic insulating layer may include a first hole corresponding to the transmissive area, and the opposite electrode may be arranged on a lateral wall of the first hole.

According to some example embodiments, an area of an opening of the opposite electrode may be less than an area of the first hole.

According to some example embodiments, the display device may further include: a functional layer arranged as one body in the display area and the sensor area and arranged between the first pixel electrode and the opposite electrode, wherein the functional layer may include an opening corresponding to the transmissive area, and an opening of the opposite electrode and an opening of the functional layer may overlap each other and constitute a transmissive hole.

According to some example embodiments, the display device may further include: a buffer layer arranged over the substrate, wherein the pixel may include a thin film transistor arranged on the buffer layer, and the first metal layer may be arranged between the substrate and the buffer layer.

According to some example embodiments, the substrate may include a first base layer, a first inorganic layer, a second base layer, and a second inorganic layer that are sequentially stacked.

According to some example embodiments, the first metal layer may be arranged under the first base layer, between the first base layer and the first inorganic layer, between the first inorganic layer and the second base layer, between the second base layer and the second inorganic layer, or on the second inorganic layer.

According to some example embodiments, the display device may further include: a third metal layer arranged below the main pixel.

According to some example embodiments, the display device may further include: a component arranged on a bottom surface of the substrate to correspond to the sensor area.

BRIEF DESCRIPTION OF THE DRAWINGS

These and/or other aspects will become more apparent and more readily appreciated from the following description of the example embodiments, taken in conjunction with the accompanying drawings in which.

DETAILED DESCRIPTION

Figure 1:
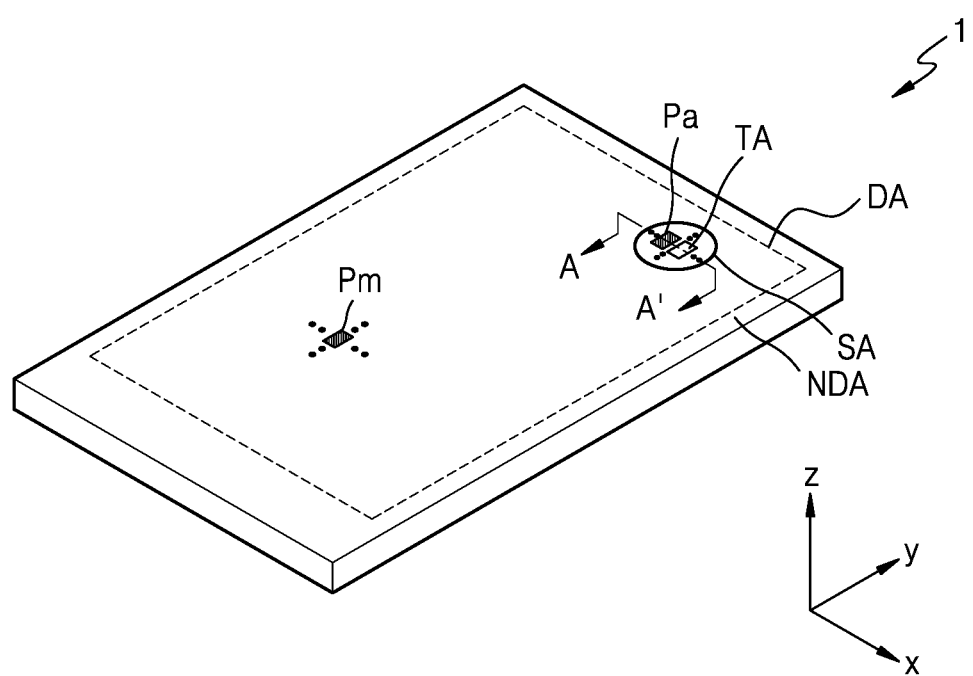
FIG. 1 is a perspective view of a display device according to some example embodiments.

Reference will now be made in more detail to aspects of some embodiments, examples of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, aspects of some example embodiments according to the disclosure will be described more fully with reference to the accompanying drawings, in which example embodiments of the disclosure are shown. When description is made with reference to the drawings, like reference numerals in the drawings denote like or corresponding elements, and repeated description thereof will be omitted.

It will be understood that although the terms "first", "second", etc. may be used herein to describe various components, these components should not be limited by these terms. These components are only used to distinguish one component from another.

As used herein, the singular forms "a", "an" and "the" are intended to include the plural forms as well, unless the context clearly indicates otherwise.

It will be further understood that the terms "comprises/includes" and/or "comprising/including" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of elements in the drawings may be exaggerated for convenience of explanation. In other words, because sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "connected to or electrically connected" to another layer, region, or component, it may be "directly electrically connected" to the other layer, region, or component or may be "indirectly connected or electrically connected" to other layer, region, or component with other layer, region, or component interposed therebetween.

FIG. 1 is a perspective view of a display device 1 according to some example embodiments.

Referring to FIG. 1, the display device 1 includes a display area DA and a non-display area NDA, the display area DA displaying an image and the non-display area NDA not displaying an image. The display device 1 may display an image by using light emitted from a plurality of main pixels Pm arranged in the display area DA.

The display device 1 includes a sensor area SA. As described below with reference to FIG. 2, the sensor area SA may include an area in which a component such as a sensor that uses infrared light, visible light, or sound is arranged below thereto. The sensor area SA may include a transmissive area TA that may transmit light and/or sound that is output from the component to the outside or progresses toward the component from the outside. According to some example embodiments, in the case where infrared light passes through the sensor area SA, a light transmittance may be 10% or more, or, for example 20% or more, 25% or more, 50% or more, 85% or more, or 90% or more.

According to some example embodiments, a plurality of auxiliary pixels Pa may be arranged in the sensor area SA. The display device may display an image (e.g., a predetermined image) by using light emitted from the auxiliary pixels Pa. An image displayed through the sensor area SA is an auxiliary image and may have a resolution less than that of an image displayed on the display area DA. That is, because the sensor area SA includes the transmissive area TA that may transmit light and/or sound, the number of auxiliary pixels Pa that may be arranged per unit area may be less than the number of main pixels Pm that may be arranged per unit area in the display area DA.

The sensor area SA may be at least partially surrounded by the display area DA. According to some example embodiments, as illustrated in FIG. 1, the sensor area SA may be entirely surrounded by the display area DA.

Although a display device according to some example embodiments is described as being an organic light-emitting display device, a display device according to embodiments of the present disclosure is not limited thereto. According to some example embodiments, a display device according to embodiments of the present disclosure may be various ones, for example, an inorganic light-emitting display apparatus, and a quantum dot light-emitting display apparatus.

Though it is shown in FIG. 1 that the sensor area SA is arranged on one side (an upper right side) of the display area DA, which has a quadrangular shape, the embodiments are not limited thereto. The shape of the display area DA may include a circle, an ellipse, or a polygon such as a triangle or a pentagon. The location and the number of sensor areas SA may be variously changed.

Figure 2:
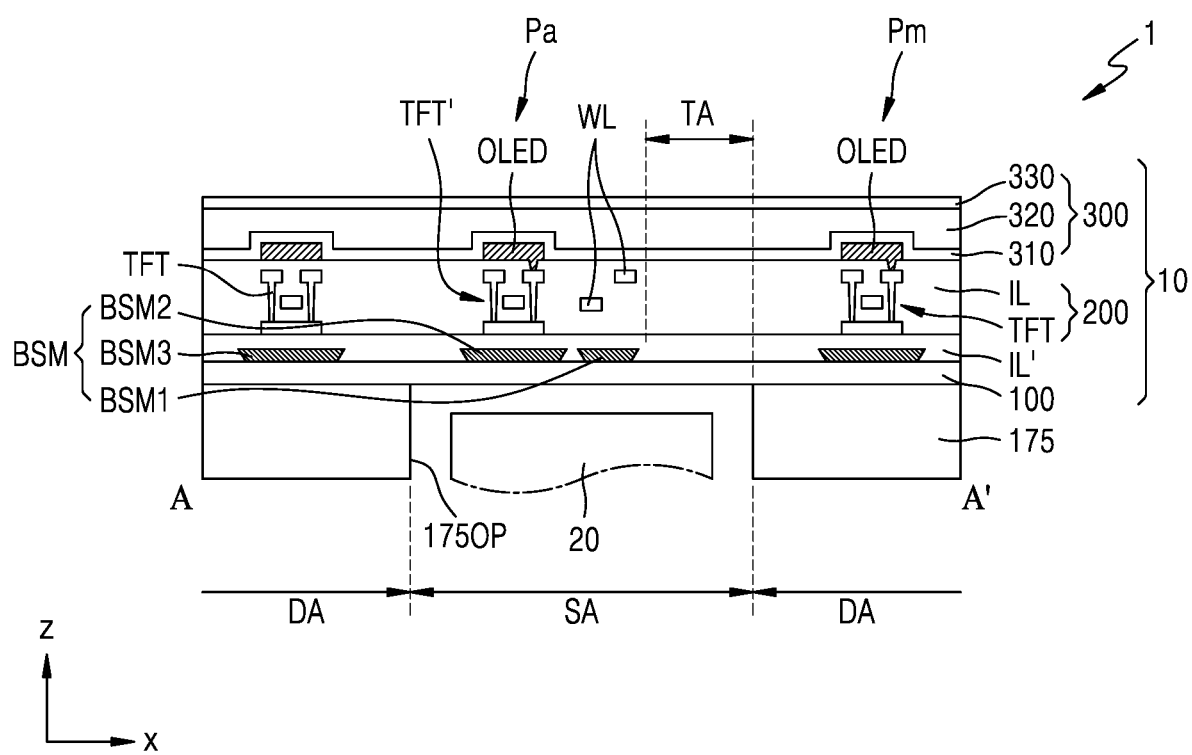
FIG. 2 is a cross-sectional view of a display device according to some example embodiments.

FIG. 2 is a cross-sectional view of the display device 1 according to some example embodiments and may correspond to a cross-section taken along line A-A' of FIG. 1.

Referring to FIG. 2, the display device 1 may include a display panel 10 including a display element, and a component 20 corresponding to the sensor area SA.

The display panel 10 may include a substrate 100, a display element layer 200, and a thin-film encapsulation layer 300, the display element layer 200 being arranged over the substrate 100, and the thin-film encapsulation layer 300 sealing the display element layer 200 as a sealing member. Also, the display panel 10 may further include a lower protective film 175 arranged under the substrate 100.

The substrate 100 may include glass or a polymer resin. The polymer resin may include polyethersulfone (PES), polyacrylate, polyetherimide (PEI), polyethylene naphthalate (PEN), polyethylene terephthalate (PET), polyphenylene sulfide (PPS), polyarylate, polyarylate, polyimide (PI), polycarbonate (PC), and cellulose acetate propionate (CAP). The substrate 100 including the polymer resin may be flexible, rollable, or bendable. The substrate 100 may have a multi-layered structure including a layer including a polymer resin, and an inorganic layer.

The display element layer 200 may include a circuit layer, an organic light-emitting diode OLED as a display element, and insulating layers IL and IL' therebetween, the circuit layer including thin film transistors TFT and TFT'.

A main pixel Pm may be arranged in the display area DA, the main pixel Pm including a main thin film transistor TFT and an organic light-emitting diode OLED connected thereto. An auxiliary pixel Pa and wirings WL may be arranged in the sensor area SA, the auxiliary pixel Pa including an auxiliary thin film transistor TFT' and an organic light-emitting diode OLED connected thereto.

Also, a transmissive area TA may be arranged in the sensor area SA, the auxiliary thin film transistor TFT' and a display element not being arranged in the transmissive area TA. It may be understood that the transmissive area TA is an area that transmits light/signals emitted from the component 20 or light/signals incident to the component 20.

The component 20 may be located in the sensor area SA. The component 20 may include an electronic element that uses light or sound. For example, the component 20 may be a sensor such as an infrared sensor that emits and/or receives light, a sensor that outputs and senses light or sound to measure a distance or recognize a fingerprint, a small lamp that outputs light, or a speaker that outputs sound. An electronic element that uses light may use light in various wavelength bands such as visible light, infrared light, and ultraviolet light. The component 20 arranged in the sensor area SA may be provided as a plurality of components. For example, as the component 20, a light-emitting element and a light-receiving element may be provided together in the sensor area SA. Alternatively, a light emitter and a light receiver may be simultaneously provided to one component 20.

According to some example embodiments, a first metal layer BSM1 and/or a second metal layer BSM2 may be arranged in the sensor area SA. The first metal layer BSM1 may correspond to a plurality of wirings WL arranged in the sensor area SA, and the second metal layer BSM2 may correspond to the auxiliary pixel Pa. Also, a third metal layer BSM3 may be arranged in the display area DA. The third metal layer BSM3 may correspond to the main pixel Pm.

The first metal layer BSM1 and the second metal layer BSM2 may be respectively arranged below the wirings WL and the auxiliary thin film transistor TFT'. The first metal layer BSM1 and the second metal layer BSM2 may prevent or reduce external light reaching the auxiliary pixel Pa including the wirings WL and the auxiliary thin film transistor TFT'. For example, light emitted from the component 20 that reaches the wirings WL and the auxiliary pixel Pa may be prevented or reduced. Also, laser light that reaches the wirings WL and the auxiliary pixel Pa during a process among processes of forming the transmissive area TA may be prevented or reduced.

Likewise, the third metal layer BSM3 may be arranged below the main thin film transistor TFT and may prevent or reduce external light reaching the main thin film transistor TFT.

According to some example embodiments, a constant voltage or a signal may be applied to the first to third metal layers BSM1, BSM2, and BSM3 to prevent a pixel circuit from being damaged by electrostatic discharge.

The thin-film encapsulation layer 300 may include at least one inorganic encapsulation layer and at least one organic encapsulation layer. With regard to this, FIG. 2 shows first and second inorganic encapsulation layers 310 and 330, and an organic encapsulation layer 320 therebetween.

The first and second inorganic encapsulation layers 310 and 330 may include at least one of inorganic insulating materials including aluminum oxide, titanium oxide, tantalum oxide, hafnium oxide, zinc oxide, silicon oxide, silicon nitride, or silicon oxynitride. The organic encapsulation layer 320 may include a polymer-based material. The polymer-based material may include an acrylic-based resin, an epoxy-based resin, polyimide, and polyethylene.

The lower protective film 175 may be attached on a backside of the substrate 100 to support and protect the substrate 100. The lower protective film 175 may include an opening 175OP corresponding to the sensor area SA. Because the lower protective film 175 includes the opening 175OP, a light transmittance of the sensor area SA may be improved. The lower protective film 175 may include PET or PI.

An area of the sensor area SA may be greater than an area in which the component 20 is arranged. Therefore, an area of the opening 175OP of the lower protective film 175 may not coincide with the area of the sensor area SA. For example, the area of the opening 175OP may be less than the area of the sensor area SA.

According to some example embodiments, an input sensing member, a reflection prevention member, and a transparent window may be further arranged on the display panel 10, the input sensing member sensing a touch input, and the reflection prevention member including a polarizer and a retarder, or a color filter and a black matrix.

Although the present embodiment shows that the thin-film encapsulation layer 300 is used as an encapsulation member sealing the display element layer 200, embodiments are not limited thereto. For example, as a member sealing the display element layer 200, a sealing substrate may be used, the sealing substrate being attached on the substrate 100 by sealant or frit.

Figure 3:
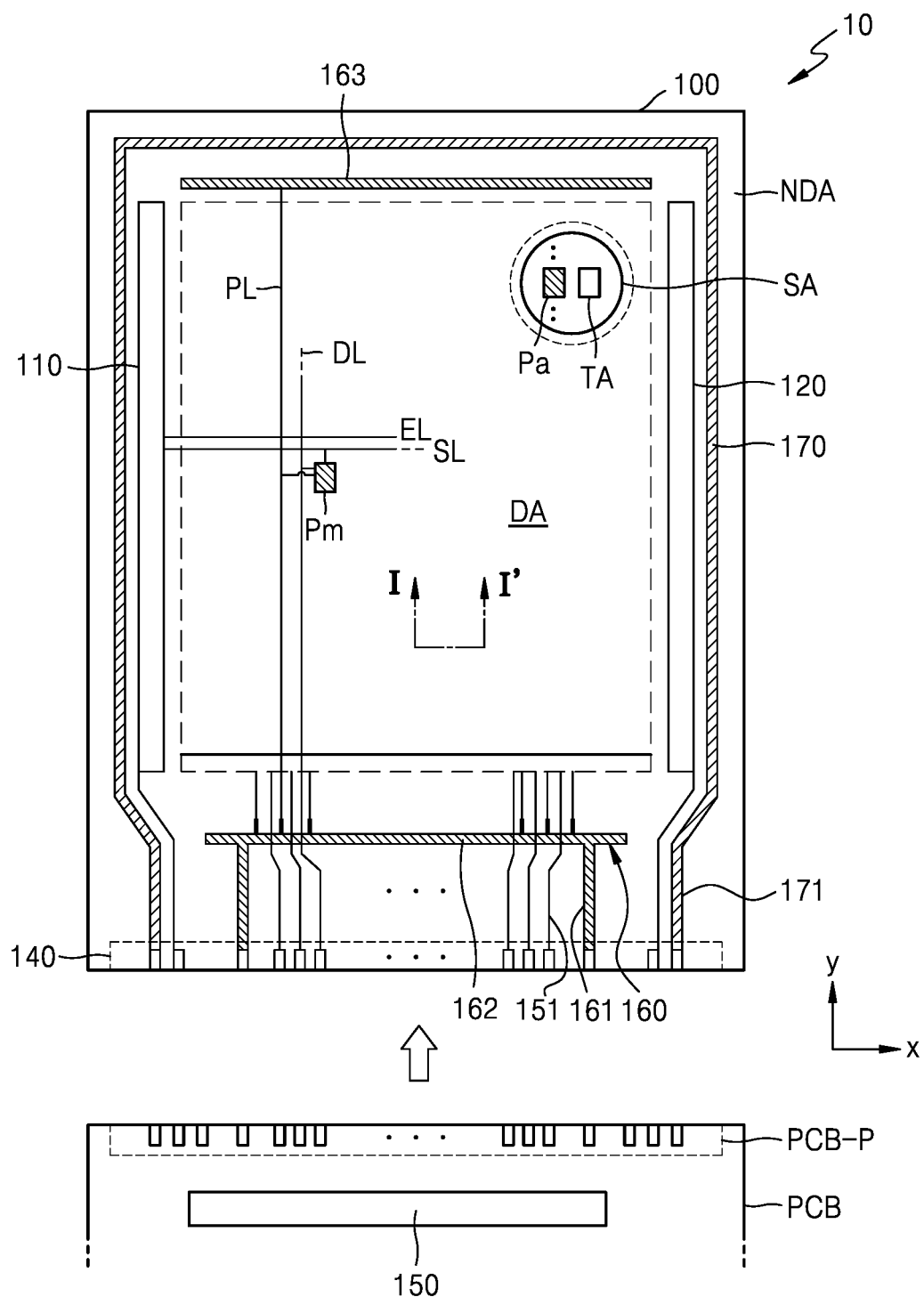
FIG. 3 is a plan view of a display device according to some example embodiments.

FIG. 3 is a plan view of the display panel 10 according to some example embodiments.

Referring to FIG. 3, the display panel 10 is arranged in the display area DA and includes a plurality of main pixels Pm. The main pixels Pm each may include a display element such as an organic light-emitting diode. Each main pixel Pm may emit, for example, red, green, blue, or white light through an organic light-emitting diode. In the present specification, it may be understood that the main pixel Pm is a pixel that emits light of one of red, green, blue, and white colors as described above. The display area DA may be covered by the encapsulation member described with reference to FIG. 2 and thus be protected from external air or moisture.

The sensor area SA may be arranged inside the display area DA. A plurality of auxiliary pixels Pa are arranged in the sensor area SA. The auxiliary pixels Pa each may include a display element such as an organic light-emitting diode. Each auxiliary pixel Pa may emit, for example, red, green, blue, or white light through an organic light-emitting diode. According to some example embodiments, it may be understood that the auxiliary pixel Pa is a pixel that emits light of one of red, green, blue, and white colors as described above. The transmissive area TA may be arranged in the sensor area SA, the transmissive area TA being arranged between the auxiliary pixels Pa.

According to some example embodiments, a pixel circuit of the main pixel Pm may be the same as that of the auxiliary pixel Pa. However, the embodiments are not limited thereto. A pixel circuit included in the main pixel Pm may be different from a pixel circuit included in the auxiliary pixel Pa.

Because the sensor area SA includes the transmissive area TA, a resolution of the sensor area SA may be less than that of the display area DA. For example, the resolution of the sensor area SA may be about ½ of the resolution of the display area DA. According to some example embodiments, the resolution of the display area DA may be 400 ppi or more, and the resolution of the sensor area SA may be 200 ppi or more.

Each of the main and auxiliary pixels Pm and Pa may be electrically connected to peripheral circuits arranged in the non-display area NDA. A first scan driving circuit 110, a second scan driving circuit 120, a terminal 140, a data driving circuit 150, a first power supply line 160, and a second power supply line 170 may be arranged in the non-display area NDA.

The first scan driving circuit 110 may provide a scan signal to each of the main and auxiliary pixels Pm and Pa through a scan line SL. The first scan driving circuit 110 may provide an emission control signal to each of the main and auxiliary pixels Pm and Pa through an emission control line EL. The second scan driving circuit 120 may be arranged in parallel to the first scan driving circuit 110 with the display area DA therebetween. Some of the main and auxiliary pixels Pm and Pa arranged in the display area DA may be electrically connected to the first scan driving circuit 110, and the rest of the main and auxiliary pixels Pm and Pa may be connected to the second scan driving circuit 120. According to some example embodiments, the second scan driving circuit 120 may be omitted.

The terminal 140 may be arranged on one side of the substrate 100. The terminal 140 may be exposed by not being covered by an insulating layer and thus be electrically connected to a printed circuit board PCB. A terminal PCB-P of the printed circuit board PCB may be electrically connected to the terminal 140 of the display panel 10. The printed circuit board PCB transfers a signal or power of a controller (not shown) to the display panel 10. A control signal generated by the controller may be transferred to each of the first scan driving circuit 110 and the second scan driving circuit 120 through the printed circuit board PCB. The controller may provide a first power voltage ELVDD and a second power voltage ELVSS (see FIGS. 4A and 4B which will be described below) to the first power supply line 160 and the second power supply line 170, respectively, through a first connection line 161 and a second connection line 171. The first power voltage ELVDD may be provided to each of the main pixel Pm and the auxiliary pixel Pa through a driving voltage line PL connected to the first power supply line 160, and the second power voltage ELVSS (also referred to as a common voltage) may be provided to an opposite electrode of each of the main pixel Pm and the auxiliary pixel Pa connected to the second power supply line 170.

The data driving circuit 150 is electrically connected to a data line DL. A data signal of the data driving circuit 150 may be provided to each of the main pixel Pm and the auxiliary pixel Pa through a connection line 151 connected to the terminal 140 and the data line DL connected to the connection line 151. Though it is shown in FIG. 3 that the data driving circuit 150 is arranged on the printed circuit board PCB, the data driving circuit 150 may be arranged on the substrate 100. For example, the data driving circuit 150 may be arranged between the terminal 140 and the first power supply line 160.

The first power supply line 160 may include a first sub-line 162 and a second sub-line 163, the first sub-line 162 and the second sub-line 163 extending in parallel to each other in an x-direction with the display area DA therebetween. The second power supply line 170 has a loop shape having one open side and may partially surround the display area DA.

Figure 4A:
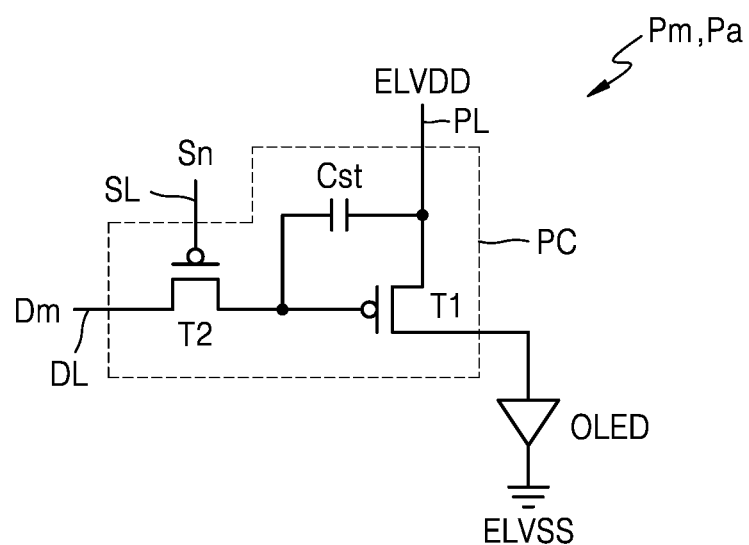
FIG. 4A is an equivalent circuit diagram of a pixel that is active matrix-driven, the pixel being arranged in a display area of a display device according to some example embodiments.
Figure 4B:
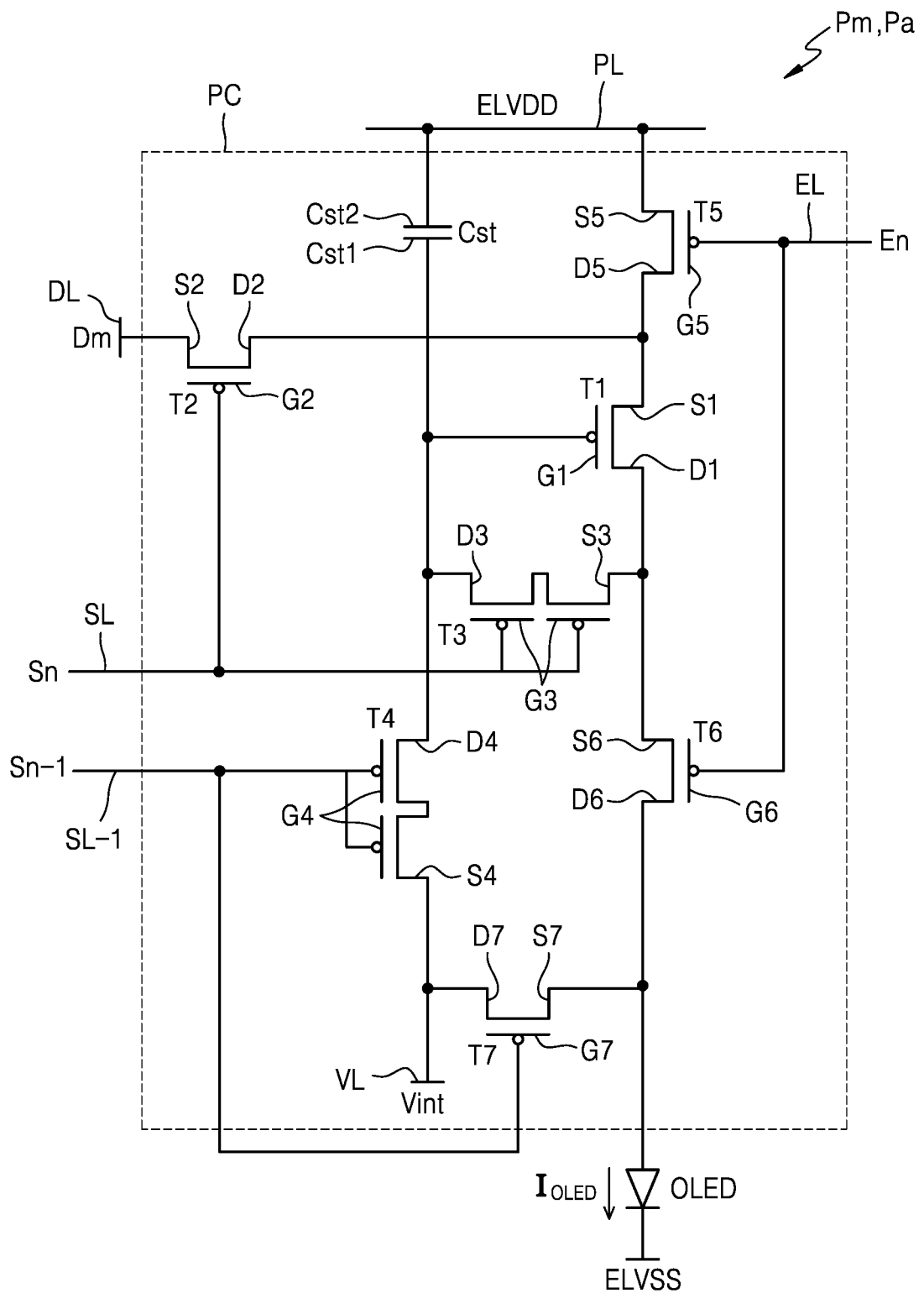
FIG. 4B is an equivalent circuit diagram of a pixel that is active matrix-driven, the pixel being arranged in a display area of a display device according to some example embodiments.

FIGS. 4A and 4B are equivalent circuit diagrams of a main pixel and/or an auxiliary pixel that may be included in a display panel according to an embodiment.

Referring to FIG. 4A, each of the main and auxiliary pixels Pm and Pa includes a pixel circuit PC and an organic light-emitting diode OLED, the pixel circuit PC being connected to a scan line SL and a data line DL, and the organic light-emitting diode OLED being connected to the pixel circuit PC.

The pixel circuit PC includes a driving thin film transistor T1, a switching thin film transistor T2, and a storage capacitor Cst. The switching thin film transistor T2 is connected to the scan line SL and the data line DL and transfers a data signal Dm to the driving thin film transistor T1 in response to a scan signal Sn input through the scan line SL, the data signal Dm being input through the data line DL.

The storage capacitor Cst is connected to the switching thin film transistor T2 and the driving voltage line PL and stores a voltage corresponding to a difference between a voltage transferred from the switching thin film transistor T2 and the first power voltage ELVDD (or a driving voltage) supplied through the driving voltage line PL.

The driving thin film transistor T1 may be connected to the driving voltage line PL and the storage capacitor Cst and may control a driving current flowing through the organic light-emitting diode OLED from the driving voltage line PL in response to a voltage stored in the storage capacitor Cst. The organic light-emitting diode OLED may emit light having a predetermined brightness by using the driving current.

Though FIG. 4A describes the case where the pixel circuit PC includes two thin film transistors and one storage capacitor, the embodiments are not limited thereto. As shown in FIG. 4B, the pixel circuit PC may include seven thin film transistors and one storage capacitor.

Referring to FIG. 4B, each of the main and auxiliary pixels Pm and Pa includes the pixel circuit PC and the organic light-emitting diode OLED connected to the pixel circuit PC. The pixel circuit PC may include a plurality of thin film transistors and a plurality of storage capacitors. The thin film transistors and the storage capacitor may be connected to signal lines SL, SL-1, EL, and DL, an initialization voltage line VL, and the driving voltage line PL.

Though it is shown in FIG. 4B that each of the main and auxiliary pixels Pm and Pa is connected to the signal lines SL, SL-1, EL, and DL, the initialization voltage line VL, and the driving voltage line PL, the embodiments are not limited thereto. According to some example embodiments, at least one of the signal lines SL, SL-1, EL, DL, the initialization voltage line VL, or the driving voltage line PL may be shared by neighboring pixels.

The plurality of thin film transistors may include the driving thin film transistor T1, the switching thin film transistor T2, a compensation thin film transistor T3, a first initialization thin film transistor T4, an operation control thin film transistor T5, an emission control thin film transistor T6, and a second initialization thin film transistor T7.

The signal lines include the scan line SL, a previous scan line SL-1, an emission control line EL, and the data line DL, the scan line SL transferring a scan signal Sn, the previous scan line SL-1 transferring a previous scan signal Sn-1 to the first initialization thin film transistor T4 and the second initialization thin film transistor T7, the emission control line EL transferring an emission control signal En to the operation control thin film transistor T5 and the emission control thin film transistor T6, and the data line DL crossing with the scan line SL and transferring a data signal Dm. The driving voltage line PL transfers the driving voltage ELVDD to the driving thin film transistor T1, and the initialization voltage line VL transfers an initialization voltage Vint that initializes the driving thin film transistor T1 and the pixel electrode of an organic light-emitting diode OLED.

A driving gate electrode G1 of the driving thin film transistor T1 is connected to a first storage capacitor plate Cst1 of the storage capacitor Cst, a driving source electrode S1 of the driving thin film transistor T1 is connected to the driving voltage line PL through the operation control thin film transistor T5, and a driving drain electrode D1 of the driving thin film transistor T1 is electrically connected to the pixel electrode of a main organic light-emitting diode OLED through the emission control thin film transistor T6. The driving thin film transistor T1 receives a data signal Dm depending on a switching operation of the switching thin film transistor T2 and supplies a driving current IDLED to the main organic light-emitting diode OLED.

A switching gate electrode G2 of the switching thin film transistor T2 is connected to the scan line SL, a switching source electrode S2 of the switching thin film transistor T2 is connected to the data line DL, and a switching drain electrode D2 of the switching thin film transistor T2 is connected to the driving source electrode S1 of the driving thin film transistor T1 and simultaneously connected to the driving voltage line PL through the operation control thin film transistor T5. The switching thin film transistor T2 is turned on in response to a scan signal Sn transferred through the scan line SL and performs a switching operation of transferring a data signal Dm transferred through the data line DL to the driving source electrode S1 of the driving thin film transistor T1.

A compensation gate electrode G3 of the compensation thin film transistor T3 is connected to the scan line SL, a compensation source electrode S3 of the compensation thin film transistor T3 is connected to the driving drain electrode D1 of the driving thin film transistor T1 and simultaneously connected to the pixel electrode of the main organic light-emitting diode OLED through the emission control thin film transistor T6, and a compensation drain electrode D3 of the compensation thin film transistor T3 is connected to the first storage capacitor plate Cst1 of the storage capacitor Cst, a first initialization drain electrode D4 of the first initialization thin film transistor T4, and the driving gate electrode G1 of the driving thin film transistor T1. The compensation thin film transistor T3 is turned on in response to a scan signal Sn transferred through the scan line SL and diode-connects the driving thin film transistor T1 by electrically connecting the driving gate electrode G1 to the driving drain electrode D1 of the driving thin film transistor T1.

A first initialization gate electrode G4 of the first initialization thin film transistor T4 is connected to the previous scan line SL-1, a first initialization source electrode S4 of the first initialization thin film transistor T4 is connected to a second initialization drain electrode D7 of the second initialization thin film transistor T7 and the initialization voltage line VL, and a first initialization drain electrode D4 of the first initialization thin film transistor T4 is connected to the first storage capacitor plate Cst1 of the storage capacitor Cst, the compensation drain electrode D3 of the compensation thin film transistor T3, and the driving gate electrode G1 of the driving thin film transistor T1. The first initialization thin film transistor T4 is turned on in response to a previous scan signal Sn-1 transferred through the previous scan line SL-1 and performs an initialization operation of transferring an initialization voltage Vint to the driving gate electrode G1 of the driving thin film transistor T1, thereby initializing a voltage of the driving gate electrode G1 of the driving thin film transistor T1.

An operation control gate electrode G5 of the operation control thin film transistor T5 is connected to the emission control line EL, an operation control source electrode S5 of the operation control thin film transistor T5 is connected to the driving voltage line PL, and an operation control drain electrode D5 of the operation control thin film transistor T5 is connected to the driving source electrode S1 of the driving thin film transistor T1 and the switching drain electrode D2 of the switching thin film transistor T2.

An emission control gate electrode G6 of the emission control thin film transistor T6 is connected to the emission control line EL, an emission control source electrode S6 of the emission control thin film transistor T6 is connected to the driving drain electrode D1 of the driving thin film transistor T1 and the compensation source electrode S3 of the compensation thin film transistor T3, and an emission control drain electrode D6 of the emission control thin film transistor T6 is connected to the second initialization source electrode S7 of the second initialization thin film transistor T7 and the pixel electrode of the organic light-emitting diode OLED.

The operation control thin film transistor T5 and the emission control thin film transistor T6 are simultaneously turned on in response to an emission control signal En transferred through the emission control line EL to allow the driving voltage ELVDD to be transferred to the organic light-emitting diode OLED and thus the driving current $I_{OLED}$ to flow through the organic light-emitting diode OLED.

A second initialization gate electrode G7 of the second initialization thin film transistor T7 is connected to the previous scan line SL-1, the second initialization source electrode S7 of the second initialization thin film transistor T7 is connected to the emission control drain electrode D6 of the emission control thin film transistor T6 and the pixel electrode of the organic light-emitting diode OLED, and the second initialization drain electrode D7 of the second initialization thin film transistor T7 is connected to the first initialization source electrode S4 of the first initialization thin film transistor T4 and the initialization voltage line VL. The second initialization thin film transistor T7 is turned on in response to a previous scan signal Sn-1 transferred through the previous scan line SL-1 and initializes the pixel electrode of the organic light-emitting diode OLED.

Though FIG. 4B shows the case where the first initialization thin film transistor T4 and the second initialization thin film transistor T7 are connected to the previous scan line SL-1, the embodiments are not limited thereto. According to some example embodiments, the first initialization thin film transistor T4 may be connected to the previous scan line SL-1 and driven in response to a previous scan signal Sn-1, and the second initialization thin film transistor T7 may be connected to a separate signal line (for example, the next scan line) and driven in response to a signal transferred through the separate signal line.

A second storage capacitor plate Cst2 of the storage capacitor Cst is connected to the driving voltage line PL, and an opposite electrode of the main organic light-emitting diode OLED is connected to the common voltage ELVSS. Therefore, the main organic light-emitting diode OLED may receive the driving current $I_{OLED}$ from the driving thin film transistor T1 and emit light, thereby displaying an image.

Though it is shown in FIG. 4B that the compensation thin film transistor T3 and the first initialization thin film transistor T4 each has a dual gate electrode, the compensation thin film transistor T3 and the first initialization thin film transistor T4 each may have one gate electrode.

According to some example embodiments, the pixel circuit PC of the main pixel Pm may be the same as that of the auxiliary pixel Pa. However, the embodiments are not limited thereto. A pixel circuit of the main pixel Pm may be different from that of the auxiliary pixel Pa. For example, the main pixel Pm may employ the pixel circuit of FIG. 4B, and the auxiliary pixel Pa may employ the pixel circuit of FIG. 4A. Various modifications may be made.

Figure 5:
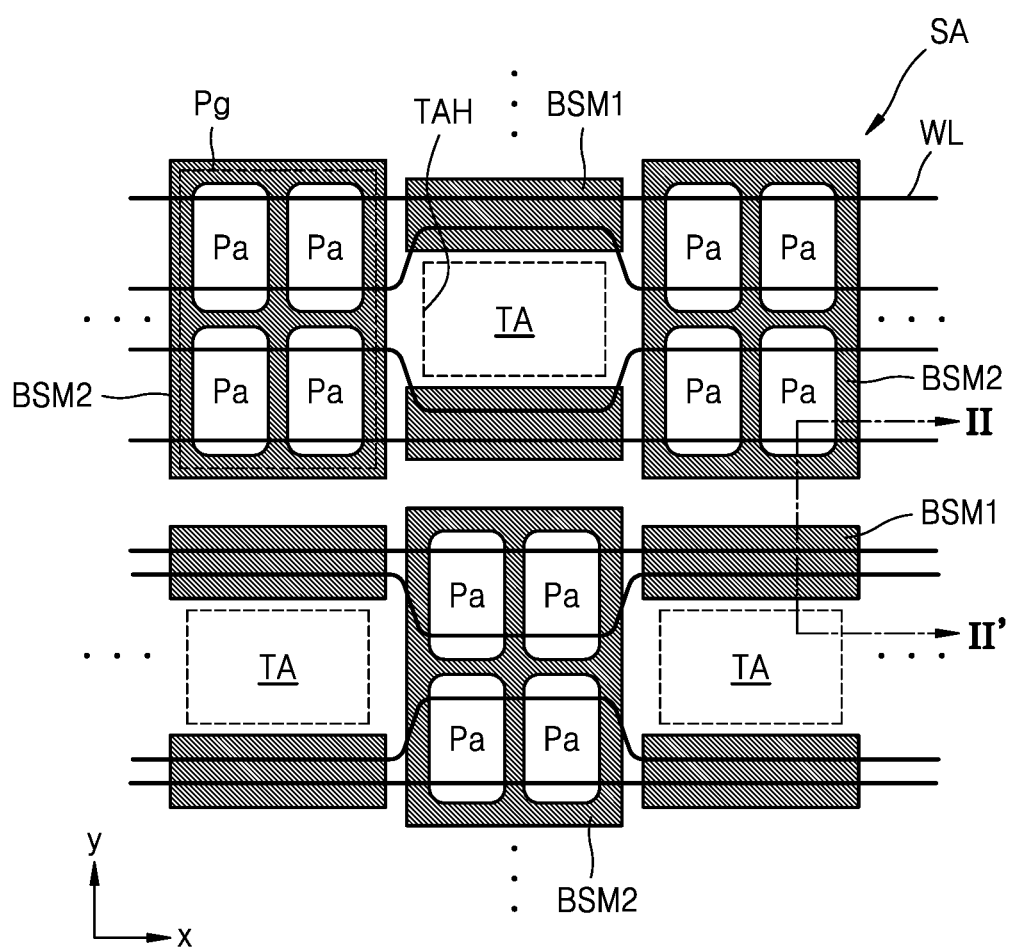
FIG. 5 is a plan view of a portion of a display device according to some example embodiments.
Figure 6:
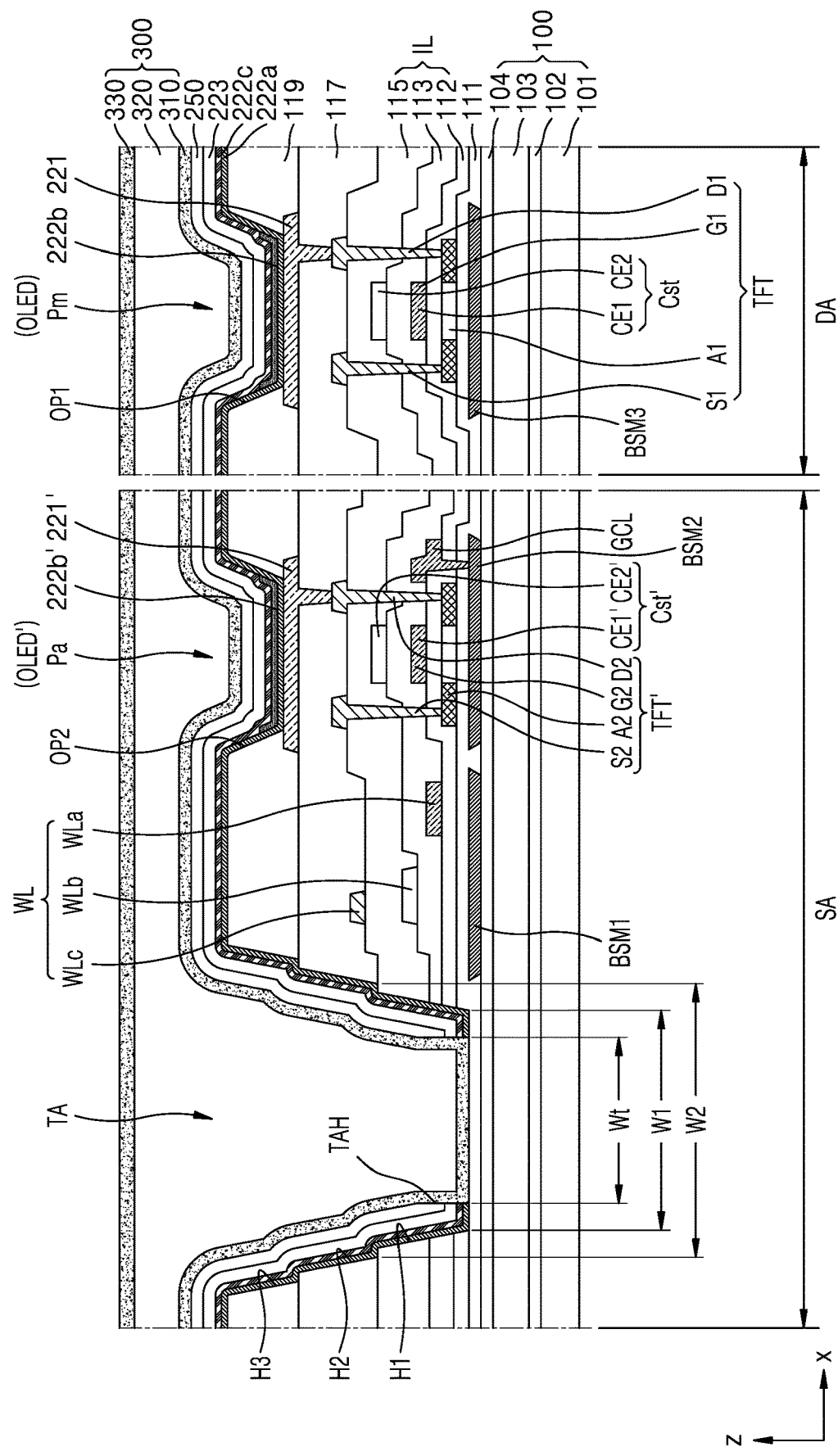
FIG. 6 is a cross-sectional view of a display device according to some example embodiments.

FIG. 5 is a plan view of a portion of the sensor area SA of FIG. 3, and FIG. 6 is a cross-sectional view of the display device taken along line I-I' of FIG. 3 and line II-II' of FIG. 5.

Referring to FIG. 5, auxiliary pixels Pa and transmissive areas TA are arranged in the sensor area SA of the display device according to an embodiment. The auxiliary pixels Pa may be successively arranged to constitute one pixel group Pg. The pixel group Pg may include at least one auxiliary pixel Pa. It is shown in FIG. 5 that one pixel group Pg includes four auxiliary pixels Pa arranged in two columns. However, the embodiments are not limited thereto. The number and the arrangement of auxiliary pixels Pa included in one pixel group Pg may be variously modified. For example, one pixel group Pg may include three auxiliary pixels Pa arranged side by side in one column.

The transmissive area TA is an area not including a display element and thus has a high light transmittance. The transmissive area TA may be provided as a plurality of transmissive areas TA in the sensor area SA. The transmissive area TA and the pixel group Pg may be alternately arranged in a first direction (an x-direction) and/or a second direction (a y-direction). Alternatively, the transmissive areas TA may surround the pixel groups Pg. Alternatively, the auxiliary pixels Pa may surround the transmissive areas TA.

The sensor area SA includes wirings WL connecting the auxiliary pixels Pa and extending in the first direction (the x-direction), and wirings (not shown) extending in the second direction (the y-direction) intersecting with the first direction (the x-direction).

According to some example embodiments, at least some of the wirings WL may detour around the transmissive area TA. The transmissive area TA may be provided to secure a light transmittance. The wirings WL may include the data line DL, the driving voltage line PL, the initialization voltage line VL, the previous scan line SL-1, the scan line SL, and the emission control line EL described as an example with reference to FIG. 4A and/or FIG. 4B.

Therefore, at least some of the wirings WL may be arranged on one side of the transmissive area TA. According to some example embodiments, the first metal layer BSM1 is introduced below the wirings WL arranged on one side of the transmissive area TA. In a plan view, the first metal layer BSM1 may be arranged between the transmissive area TA and the auxiliary pixel Pa. This is for protecting the wirings WL during a process. This will be described in more detail below.

According to some example embodiments, the first metal layer BSM1 may be provided in an island shape, and one first metal layer BSM1 may correspond to the plurality of wirings WL. That is, one first metal layer BSM1 may overlap the plurality of wirings WL. Therefore, external light may be prevented from reaching the wirings WL.

According to some example embodiments, the first metal layer BSM1 may be connected to one of the wirings WL through a contact hole. Since the first metal layer BSM1 receives a voltage or a signal of the wirings, a probability that electrostatic discharge occurs may be remarkably reduced. According to some example embodiments, the first metal layer BSM1 may be connected to the scan line SL through a contact hole. Therefore, because the first metal layer BSM1 may serve as a portion of the scan line SL, a resistance value of a wiring transferring a scan signal may be reduced. This means that, when the first metal layer BSM1 is connected to the scan line SL, an RC delay may be reduced.

According to some example embodiments, the second metal layer BSM2 may be arranged below the auxiliary pixel Pa. The second metal layer BSM2 may prevent external light from reaching the auxiliary thin film transistor TFT' included in the auxiliary pixel Pa, thereby protecting the auxiliary thin film transistor TFT' and stabilizing a characteristic of the auxiliary thin film transistor TFT'.

According to some example embodiments, the second metal layer BSM2 may be provided in an island shape, and one second metal layer BSM2 may correspond to the plurality of auxiliary pixels Pa. For example, one second metal layer BSM2 may entirely overlap one pixel group Pg.

According to some example embodiments, the first metal layer BSM1 and the second metal layer BSM2 may be apart from each other and may receive different voltages or signals. According to some example embodiments, the second metal layer BSM2 may be connected to the driving voltage line PL through a contact hole. Since the second metal layer BSM2 is not floated and is connected to the driving voltage line PL, a probability that electrostatic discharge occurs may be remarkably reduced.

Referring to FIG. 6, a display device according to some example embodiments includes the display area DA and the sensor area SA. The main pixel Pm is arranged in the display area DA, and the auxiliary pixel Pa and the transmissive area TA are arranged in the sensor area SA. A plurality of wirings WL are arranged on one side of the transmissive area TA and between the transmissive area TA and the auxiliary pixel Pa.

The main pixel Pm may include the main thin film transistor TFT, a main storage capacitor Cst, and the main organic light-emitting diode OLED. The auxiliary pixel Pa may include the auxiliary thin film transistor TFT', an auxiliary storage capacitor Cst', and an auxiliary organic light-emitting diode OLED'. The transmissive area TA may include a transmissive hole TAH corresponding to the transmissive area TA.

The first metal layer BSM1 is arranged below the wirings WL arranged on one side of the transmissive area TA, the first metal layer BSM1 overlapping the wirings WL. According to some example embodiments, a lateral surface of the first metal layer BSM1 may have an inverse-tapered shape with respect to a top surface of the substrate 100.

Also, the second metal layer BSM2 may be arranged below the auxiliary thin film transistor TFT' of the auxiliary pixel Pa, the second metal layer BSM2 overlapping the auxiliary thin film transistor TFT'. The third metal layer BSM3 may be arranged below the main thin film transistor TFT of the main pixel Pm, the third metal layer BSM3 overlapping the main thin film transistor TFT. A lateral surface of the second metal layer BSM2 and/or the third metal layer BSM3 may have an inverse-tapered shape with respect to the top surface of the substrate 100.

Hereinafter, a structure in which elements of a display device, according to some example embodiments, are stacked is described.

The substrate 100 may include a polymer resin. The substrate 100 may include a base layer including a polymer resin, and an inorganic layer. For example, the substrate 100 may include a first base layer 101, a first inorganic layer 102, a second base layer 103, and a second inorganic layer 104 that are sequentially stacked.

The first and second base layers 101 and 103 each may include a polymer resin. For example, the first and second base layers 101 and 103 may include a polymer resin such as polyethersulfone (PES), polyacrylate, polyetherimide (PEI), polyethylene naphthalate (PEN), polyethylene terephthalate (PET), polyphenylene sulfide (PPS), polyarylate, polyimide (PI), polycarbonate (PC), cellulose tri acetate (TAC) and cellulose acetate propionate (CAP). The polymer resin may be transparent.

The first and second inorganic layers 102 and 104 each may be a barrier layer preventing the penetration of foreign substances and may include a single layer or a multi-layer including an inorganic material such as silicon nitride ($SiN_x$) and/or silicon oxide ($SiO_x$).

A buffer layer 111 may be located on the substrate 100, may reduce or prevent the penetration of foreign substances, moisture, or external air from below the substrate 100, and provide a flat surface on the substrate 100. The buffer layer 111 may include an inorganic material such as an oxide or a nitride, or an organic material, or an organic/inorganic composite material and include a single-layered or multi-layered structure of an inorganic material and an organic material.

According to some example embodiments, the first to third metal layers BSM1, BSM2, and BSM3 may be arranged between the substrate 100 and the buffer layer 111, that is, the second inorganic layer 104 and the buffer layer 111. According to some example embodiments, the first to third metal layers BSM1, BSM2, and BSM3 may be arranged below the second inorganic layer 104. For example, the first to third metal layers BSM1, BSM2, and BSM3 may be arranged between the second base layer 103 and the second inorganic layer 104. According to some example embodiments, at least one of the first to third metal layers BSM1, BSM2, or BSM3 may be arranged on a different layer.

The first metal layer BSM1 may be arranged below the wirings WL arranged between the transmissive area TA and the auxiliary pixel Pa to prevent the wirings WL from being damaged during a process.

The second metal layer BSM2 may be arranged below the auxiliary pixel Pa to prevent the auxiliary thin film transistor TFT' arranged in the auxiliary pixel Pa from being damaged, or prevent a characteristic of the auxiliary thin film transistor TFT' from being deteriorated.

The third metal layer BSM2 may be arranged below the main pixel Pm to prevent the main thin film transistor TFT arranged in the main pixel Pm from being damaged, or prevent a characteristic of the main thin film transistor TFT from being deteriorated.

The first to third metal layers BSM1, BSM2, and BSM3 may be connected to wirings WL and GCL arranged on different layers. The first to third metal layers BSM1, BSM2, and BSM3 may receive a constant voltage or a signal from the wirings WL and GCL. For example, the first to third metal layers BSM1, BSM2, and BSM3 may receive a driving voltage ELVDD or a scan signal. Since the first to third metal layers BSM1, BSM2, and BSM3 may receive a constant voltage or a scan signal, a probability that electrostatic discharge occurs may be remarkably reduced. However, the embodiments are not limited thereto. All of the first to third metal layers BSM1, BSM2, and BSM3 may not receive an electric signal. Also, at least one of the first to third metal layers BSM1, BSM2, or BSM3 may be electrically floated and the rest of the first to third metal layers BSM1, BSM2, and BSM3 may receive an electric signal. Various modifications may be made.

The first to third metal layers BSM1, BSM2, and BSM3 may include at least one of Al, Pt, Pd, Ag, Mg, Au, Ni, Nd, Ir, Cr, Li, Ca, Mo, Ti, W, or Cu. The first to third metal layers BSM1, BSM2, and BSM3 may include a single layer or a multi-layer including the above materials.

Though the drawings show all of the first to third metal layers BSM1, BSM2, and BSM3, at least one of the first to third metal layers BSM1, BSM2, or BSM3 may be omitted according to an embodiment.

Also, it is shown that a lateral surface of the first to third metal layers BSM1, BSM2, and BSM3 has an inverse-tapered shape. That is, a width of the first to third metal layers BSM1, BSM2, and BSM3 in the first direction (the x-direction) may increase away from the top surface of the substrate 100. However, the embodiments are not limited thereto. Only a lateral surface of the first metal layer BSM1 may have an inverse-tapered shape, and a lateral surface of each of the second metal layer BSM2 and the third metal layer BSM3 may have a forward-tapered shape. Alternatively, only a lateral surface of the first metal layer BSM1 and the second metal layer BSM2 may have an inverse-tapered shape.

A lateral surface of the first metal layer BSM1 may have an inverse-taped shape so as to prevent laser light from reaching the wirings WL during a process of forming a transmissive hole. This will be described below.

The main thin film transistor TFT and the auxiliary thin film transistor TFT' may be arranged on the buffer layer 111. The main thin film transistor TFT includes a first semiconductor layer A1, a first gate electrode G1, a first source electrode S1, and a first drain electrode D1. The auxiliary thin film transistor TFT' includes a second semiconductor layer A2, a second gate electrode G2, a second source electrode S2, and a second drain electrode D2. The main thin film transistor TFT may be connected to the main organic light-emitting diode OLED in the display area DA to drive the main organic light-emitting diode OLED. The auxiliary thin film transistor TFT' may be connected to the auxiliary organic light-emitting diode OLED' in the sensor area SA to drive the auxiliary organic light-emitting diode OLED'.

The first semiconductor layer A1 and the second semiconductor layer A2 may be arranged on the buffer layer 111 and may include polycrystalline silicon. According to some example embodiments, the first semiconductor layer A1 and the second semiconductor layer A2 may include amorphous silicon. According to some example embodiments, the first semiconductor layer A1 and the second semiconductor layer A2 may include an oxide of at least one of In, Ga, Sn, Zr, V, Hf, Cd, Ge, Cr, Ti, or Zn. The first semiconductor layer A1 and the second semiconductor layer A2 each may include a channel region, a source region, and a drain region, the source region and the drain region being doped with impurities.

The first semiconductor layer A1 may overlap the third metal layer BSM3 with the buffer layer 111 therebetween. According to some example embodiments, a width of the first semiconductor layer A1 may be less than a width of the third metal layer BSM3. Therefore, when projected in a direction perpendicular to the substrate 100, the first semiconductor layer A1 may entirely overlap the third metal layer BSM3.

The second semiconductor layer A2 may overlap the second metal layer BSM2 with the buffer layer 111 therebetween. According to some example embodiments, a width of the second semiconductor layer A2 may be less than a width of the second metal layer BSM2. Therefore, when projected in a direction perpendicular to the substrate 100, the second semiconductor layer A2 may entirely overlap the second metal layer BSM2.

A first gate insulating layer 112 may cover the first semiconductor layer A1 and the second semiconductor layer A2. The first gate insulating layer 112 may include an inorganic insulating material such as $SiO_2$, $SiN_x$, SiON, $Al_2O_3$, $TiO_2$, $Ta_2O_5$, $HfO_2$, or $ZnO_2$. The first gate insulating layer 112 may include a single layer or a multi-layer including the above inorganic insulating materials.

A first gate electrode G1 and a second gate electrode G2 are arranged on the first gate insulating layer 112, the first gate electrode G1 and the second gate electrode G2 respectively overlapping the first semiconductor layer A1 and the second semiconductor layer A2. The first gate electrode G1 and the second gate electrode G2 may include a single layer and a multi-layer including at least one of Mo, Al, Cu, or Ti. For example, the first gate electrode G1 and the second gate electrode G2 each may include a single Mo layer.

A second gate insulating layer 113 may cover the first gate electrode G1 and the second gate electrode G2. The second gate insulating layer 113 may include an inorganic insulating material such as $SiO_2$, $SiN_x$, SiON, $Al_2O_3$, $TiO_2$, $Ta_2O_5$, $HfO_2$, or $ZnO_2$. The second gate insulating layer 113 may include a single layer or a multi-layer including the above inorganic insulating materials.

A first top electrode CE2 of the main storage capacitor Cst and a second top electrode CE2' of the auxiliary storage capacitor Cst' may be arranged on the second gate insulating layer 113.

In the display area DA, the first top electrode CE2 may overlap the gate electrode G1 therebelow. The first gate electrode G1 and the first top electrode CE2 may constitute the main storage capacitor Cst, the first gate electrode G1 and the first top electrode CE2 overlapping each other with the second gate insulating layer 113 therebetween. The first gate electrode G1 may serve as a first bottom electrode CE1 of the main storage capacitor Cst.

In the sensor area SA, the second top electrode CE2' may overlap the second gate electrode G2 therebelow. The second gate electrode G2 and the second top electrode CE2' may constitute the auxiliary storage capacitor Cst', the second gate electrode G2 and the second top electrode CE2' overlapping each other with the second gate insulating layer 113 therebetween. The second gate electrode G2 may serve as a second bottom electrode CE1' of the auxiliary storage capacitor Cst'.

The first top electrode CE2 and the second top electrode CE2' each may include Al, Pt, Pd, Ag, Mg, Au, Ni, Nd, Ir, Cr, Li, Ca, Mo, Ti, W, and/or Cu, and may include a single layer or a multi-layer including the above materials.

An interlayer insulating layer 115 may cover the first top electrode CE2 and the second top electrode CE2'. The interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

When the first gate insulating layer 112, the second gate insulating layer 113, and the interlayer insulating layer 115 are collectively referred to as inorganic insulating layers IL, the inorganic insulating layers IL may include a first hole H1 corresponding to the transmissive area TA. The first hole H1 may expose a top surface of the buffer layer 111 or the substrate 100. The first hole H1 may include a first opening of the first gate insulating layer 112, a second opening of the second gate insulating layer 113, and a third opening of the interlayer insulating layer 115 each corresponding to the transmissive area TA, the first opening, the second opening, and the third opening overlapping one another. The first to third openings may be respectively formed through separate processes, or simultaneously formed through the same process. Alternatively, the first opening and the second opening may be simultaneously formed, and the third opening may be separately formed. Various modifications may be made. In the case where the first to third openings are formed through separate processes, a step difference may be formed on a lateral surface of the first hole H1.

The inorganic insulating layer IL may include a groove instead of the first hole H1 exposing the buffer layer 111. For example, the first gate insulating layer 112 of the inorganic insulating layers IL may be continuously arranged to correspond to the transmissive area TA, and the second gate insulating layer 113 and the interlayer insulating layer 115 may respectively include the second opening and the third opening corresponding to the transmissive area TA.

Alternatively, the first gate insulating layer 112 and the second gate insulating layer 113 may be continuously arranged to correspond to the transmissive area TA, and the interlayer insulating layer 115 may include the third opening corresponding to the transmissive area TA. Various modifications may be made.

According to some example embodiments, the inorganic insulating layer IL may not include the first hole H1 corresponding to the transmissive area TA. Since the inorganic insulating layer IL may have a transmittance of light that may be transmitted/received by the component 20 (see FIG. 2), the inorganic insulating layer IL may not include a hole corresponding to the transmissive area TA.

The source electrodes S1 and S2 and the drain electrodes D1 and D2 may be arranged on the interlayer insulating layer 115. The source electrodes S1 and S2 and the drain electrodes D1 and D2 may include a conductive material including Mo, Al, Cu, and Ti and include a single layer or a multi-layer including the above materials. For example, the source electrodes S1 and S2 and the drain electrodes D1 and D2 each may have a multi-layered structure of Ti/Al/Ti.

A planarization layer 117 may cover the source electrodes S1 and S2 and the drain electrodes D1 and D2. The planarization layer 117 may have a flat top surface such that a first pixel electrode 221 and a second pixel electrode 221' thereon are formed flat.

The planarization layer 117 may include a single layer or a multi-layer including an organic material or an inorganic material. The planarization layer 117 may include a general-purpose polymer such as benzocyclobutene (BCB), polyimide, hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof. Also, the planarization layer 117 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). After the planarization layer 117 is formed, chemical mechanical polishing may be performed so as to provide a flat top surface to the planarization layer 117.

The planarization layer 117 may include a second hole H2 corresponding to the transmissive area TA. The second hole H2 may overlap the first hole H1. Though it is shown in the drawing that a bottom width of the second hole H2 is greater than a bottom width of the first hole H1, the embodiments are not limited thereto. For example, the planarization layer 117 may cover edges of the first hole H1 of the inorganic insulating layer IL and a width of the second hole H2 may be less than a width of the first hole H1.

There is an opening in the planarization layer 117, the opening exposing one of the first source electrode S1 and the first drain electrode D1 of the main thin film transistor TFT. The first pixel electrode 221 may be electrically connected to the main thin film transistor TFT by contacting the first source electrode S1 or the first drain electrode D1 through the opening in the planarization layer 117.

Also, the planarization layer 117 includes an opening exposing one of the second source electrode S2 and the second drain electrode D2 of the auxiliary thin film transistor TFT'. The second pixel electrode 221' may be electrically connected to the auxiliary thin film transistor TFT' by contacting the second source electrode S2 or the second drain electrode D2 through the opening.

The first pixel electrode 221 and the second pixel electrode 221' may include a conductive oxide such as indium tin oxide (ITO), zinc oxide (IZO), zinc oxide (ZnO), indium oxide ($In_2O_3$), indium gallium oxide (IGO), or aluminum zinc oxide (AZO). According to some example embodiments, the first pixel electrode 221 and the second pixel electrode 221' each may include a reflective layer including Ag, Mg, Al, Pt, Pd, Au, Ni, Nd, Ir, Cr, or a compound thereof. According to some example embodiments, the first pixel electrode 221 and the second pixel electrode 221' may further include a layer including ITO, IZO, ZnO, or $In_2O_3$ on/under the reflective layer. According to some example embodiments, the first pixel electrode 221 and the second pixel electrode 221' may have a stacked structure of ITO/Ag/ITO.

A pixel-defining layer 119 may cover edges of each of the first pixel electrode 221 and the second pixel electrode 221'. The pixel-defining layer 119 includes a first opening OP1 and a second opening OP2, the first opening OP1 and the second opening OP2 respectively overlapping the first pixel electrode 221 and the second pixel electrode 221' and defining an emission area of a pixel. The pixel-defining layer 119 may prevent an arc, etc. from occurring at edges of the pixel electrodes, that is, the first and second pixel electrodes 221 and 221' by increasing a distance between the edges of the first and second pixel electrodes 221 and 221' and the opposite electrode 223 over the first and second pixel electrodes 221 and 221'. The pixel-defining layer 119 may include an organic insulating material such as polyimide, polyamide, an acrylic resin, BCB, HMDSO, and a phenolic resin. The pixel-defining layer 119 may be formed by a method such as spin coating.

The pixel-defining layer 119 may include a third hole H3 located in the transmissive area TA. The third hole H3 may overlap the first hole H1 and the second hole H2. Since the first hole H1, the second hole H2, and the third hole H3 are formed, a light transmittance of the transmissive area TA may be improved. An opposite electrode 223, which will be described below, may be arranged on inner walls of the first hole H1, the second hole H2, and the third hole H3.

Wirings WL are arranged between the transmissive area TA and the auxiliary pixel Pa, the wirings WL detouring around the transmissive area TA. The wirings WL may include wirings WLa, WLb, and WLc arranged on different layers. For example, the wirings WL may include a first wiring WLa, a second wiring WLb, and a third wiring WLc, the first wiring Wa being arranged on the same layer on which the gate electrodes G1 and G2 are arranged, the second wiring Wb being arranged on the same layer on which the first and second top electrodes CE2 and CE2' are arranged, and the third wiring We being arranged on the same layer on which the source electrodes S1 and S2 are arranged.

The wirings WL may overlap the first metal layer BSM1 with the buffer layer 111 therebetween. According to some example embodiments, one first metal layer BSM1 may correspond to a plurality of wirings WL. Therefore, in a direction perpendicular to the substrate 100, the plurality of wirings WL may entirely overlap the first metal layer BSM1.

A first functional layer 222a covers the pixel-defining layer 119. The first functional layer 222a may include a single layer or a multi-layer. The first functional layer 222a may include a hole transport layer (HTL) which has a single-layered structure. Alternatively, the first functional layer 222a may include a hole injection layer (HIL) and a hole transport layer (HTL). The first functional layer 222a may be provided as one body so as to correspond to main pixels Pm and auxiliary pixels Pa included in the display area DA and the sensor area SA.

A first emission layer 222b and a second emission layer 222b' are arranged on the first functional layer 222a, the first emission layer 222b and the second emission layer 222b' respectively corresponding to the first pixel electrode 221 and the second pixel electrode 221'. The first emission layer 222b and the second emission layer 222b' may include a polymer material or a low molecular weight material, and emit red, green, blue, or white light.

A second functional layer 222c may be formed on the first emission layer 222b and the second emission layer 222b'. The second functional layer 222c may include a single layer or a multi-layer. The second functional layer 222c may include an electron transport layer (ETL) and/or an electron injection layer (EIL). The second functional layer 222c may be provided as one body so as to correspond to main pixels Pm and auxiliary pixels Pa included in the display area DA and the sensor area SA. The first functional layer 222a and/or the second functional layer 222c may be omitted.

The opposite electrode 223 is arranged on the second functional layer 222c. The opposite electrode 223 may include a conductive material having a small work function. For example, the opposite electrode 223 may include a (semi) transparent layer including Ag, Mg, Al, Pt, Pd, Au, Ni, Nd, Ir, Cr, Li, Ca, or an alloy thereof. Alternatively, the opposite electrode 223 may further include a layer including ITO, IZO, ZnO, or $In_2O_3$ on the (semi) transparent layer including the above material. The opposite electrode 223 may be provided as one body so as to correspond to the main pixels Pm and the auxiliary pixels Pa included in the display area DA and the sensor area SA.

Layers ranging from the first pixel electrode 221 to the opposite electrode 223 in the display area DA may constitute the main organic light-emitting diode OLED. Layers ranging from the second pixel electrode 221' to the opposite electrode 223 in the sensor area SA may constitute the auxiliary organic light-emitting diode OLED'.

A capping layer 250 may be formed on the opposite electrode 223. The capping layer 250 may include LiF. Alternatively, the capping layer 250 may include an inorganic insulating material such as silicon nitride and/or an organic insulating material. According to some example embodiments, the capping layer 250 may be omitted.

According to some example embodiments, the first functional layer 222a, the second functional layer 222c, the opposite electrode 223, and the capping layer 250 each may include a transmissive hole TAH corresponding to the transmissive area TA. That is, the first functional layer 222a, the second functional layer 222c, the opposite electrode 223, and the capping layer 250 each may include an opening corresponding to the transmissive area TA. According to some example embodiments, widths of the openings constituting the transmissive hole TAH may be substantially the same. For example, a width of the opening of the opposite electrode 223 may be substantially the same as a width of the transmissive hole TAH.

Also, according to some example embodiments, the first functional layer 222a, the second functional layer 222c, and the capping layer 250 may be omitted. In this case, the opening of the opposite electrode 223 may serve as the transmissive hole TAH.

The transmissive hole TAH corresponds to the transmissive area TA may mean that the transmissive hole TAH overlaps the transmissive area TA. In this case, the area of the transmissive hole TAH may be less than an area of the first hole H1 formed in the inorganic insulating layer IL. For this, it is shown in FIG. 6 that a width Wt of the transmissive hole TAH is less than a width W1 of the first hole H1. Here, the area of the transmissive hole TAH and the area of the first hole H1 may be defined as a narrowest area of the opening.

According to some example embodiments, the first functional layer 222a, the second functional layer 222c, the opposite electrode 223, and the capping layer 250 may be arranged on lateral surfaces of the first hole H1, the second hole H2, and the third hole H3. According to some example embodiments, an inclination of the lateral surface of the first hole H1, the second hole H2, and the third hole H3 with respect to the top surface of the substrate 100 may be gentler than an inclination of a lateral surface of the transmissive hole TAH with respect to the top surface of the substrate 100.

Since forming of the transmissive hole TAH in the transmissive area TA means that a member such as the opposite electrode 223 is removed, a light transmittance in the transmissive area TA may be remarkably increased.

The main organic light-emitting diode OLED and the auxiliary organic light-emitting diode OLED' may be sealed by the thin-film encapsulation layer 300. The thin-film encapsulation layer 300 may be arranged on the capping layer 250. The thin-film encapsulation layer 300 may prevent external moisture or foreign substances from penetrating into the main organic light-emitting diode OLED and the auxiliary organic light-emitting diode OLED'.

The thin-film encapsulation layer 300 may include at least one inorganic encapsulation layer and at least one organic encapsulation layer. With regard to this, it is shown in FIG. 6 that the thin-film encapsulation layer 300 has a structure in which the first inorganic encapsulation layer 310, the organic encapsulation layer 320, and the second inorganic encapsulation layer 330 are stacked. According to some example embodiments, the number of organic encapsulation layers, the number of inorganic encapsulation layers, and a stacking sequence may be modified.

The first inorganic encapsulation layer 310 and the second inorganic encapsulation layer 330 each may include at least one inorganic insulating material including aluminum oxide, titanium oxide, tantalum oxide, hafnium oxide, zinc oxide, silicon oxide, silicon nitride, and silicon oxynitride, and may be formed by chemical vapor deposition (CVD). The organic encapsulation layer 320 may include a polymer-based material. The polymer-based material may include a silicon-based resin, an acrylic-based resin, an epoxy-based resin, polyimide, and polyethylene.

The first inorganic encapsulation layer 310, the organic encapsulation layer 320, and the second inorganic encapsulation layer 330 each may be formed as one body so as to cover the display area DA and the sensor area SA. Therefore, the first inorganic encapsulation layer 310, the organic encapsulation layer 320, and the second inorganic encapsulation layer 330 may be arranged inside the transmissive hole TAH.

According to some example embodiments, the organic encapsulation layer 320 may be formed as one body so as to cover the display area DA and the sensor area SA, and may not be present in the transmissive area TA. In other words, the organic encapsulation layer 320 may include an opening corresponding to the transmissive area TA. In this case, the first inorganic encapsulation layer 310 and the second inorganic encapsulation layer 330 may contact each other inside the transmissive hole TAH.

Figure 7A:
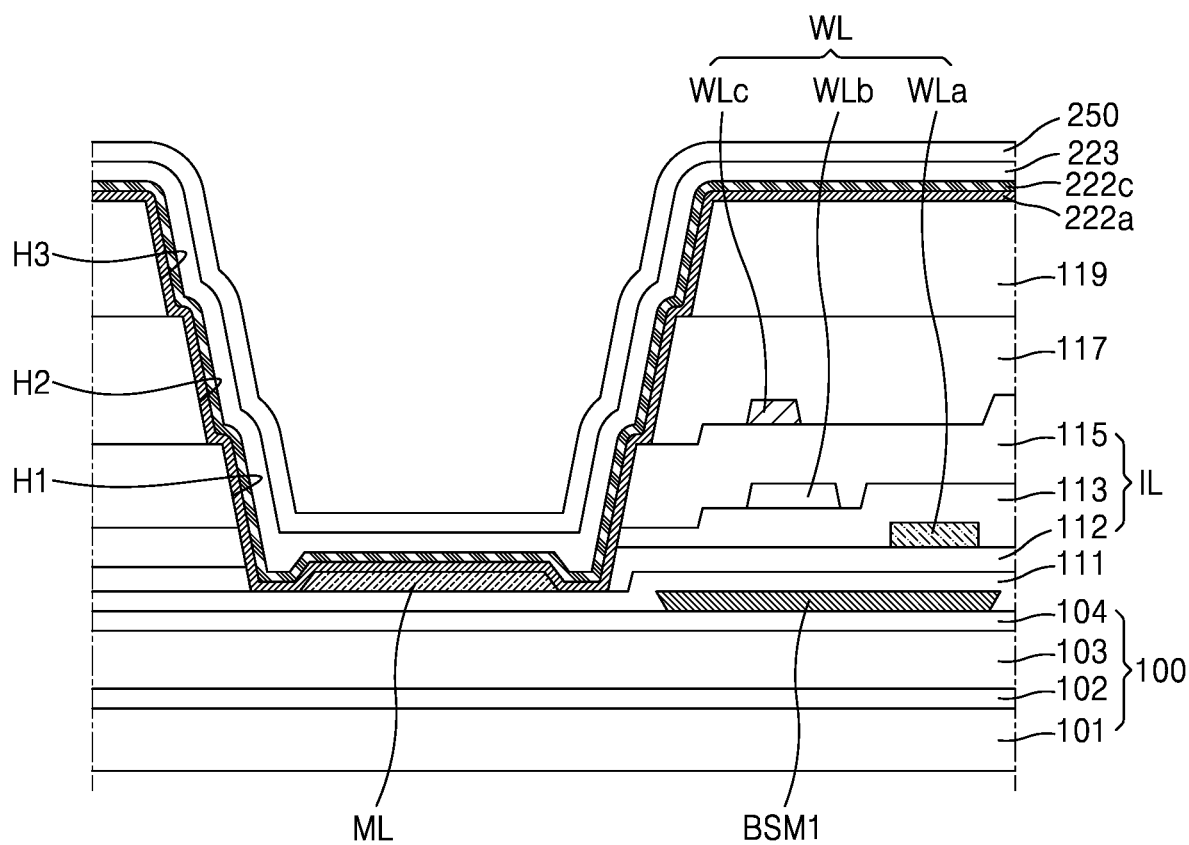
FIGS. 7A to 7C are cross-sectional views of a method of manufacturing a display device, according to some example embodiments.
Figure 7B:
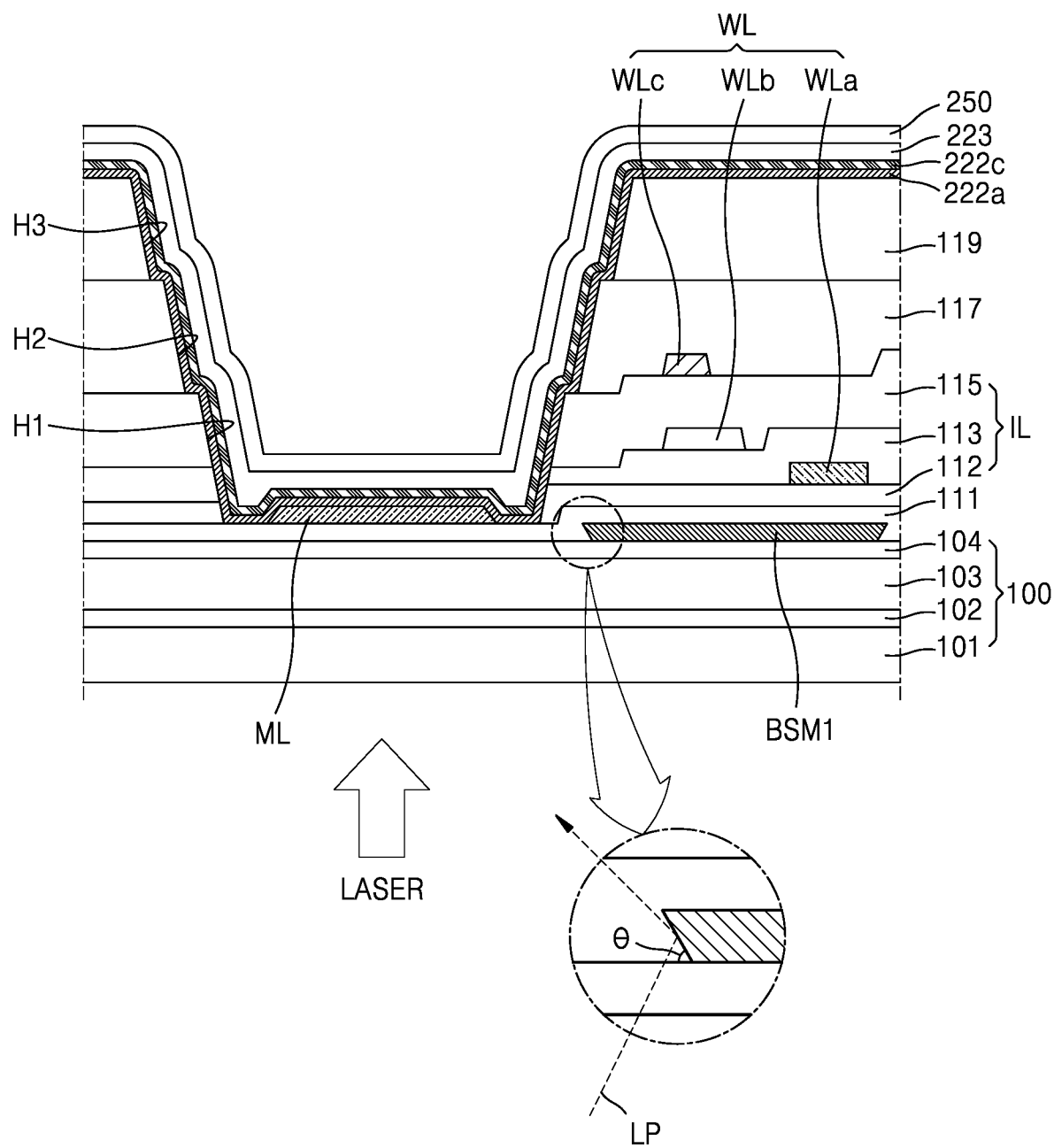
Figure 7C:
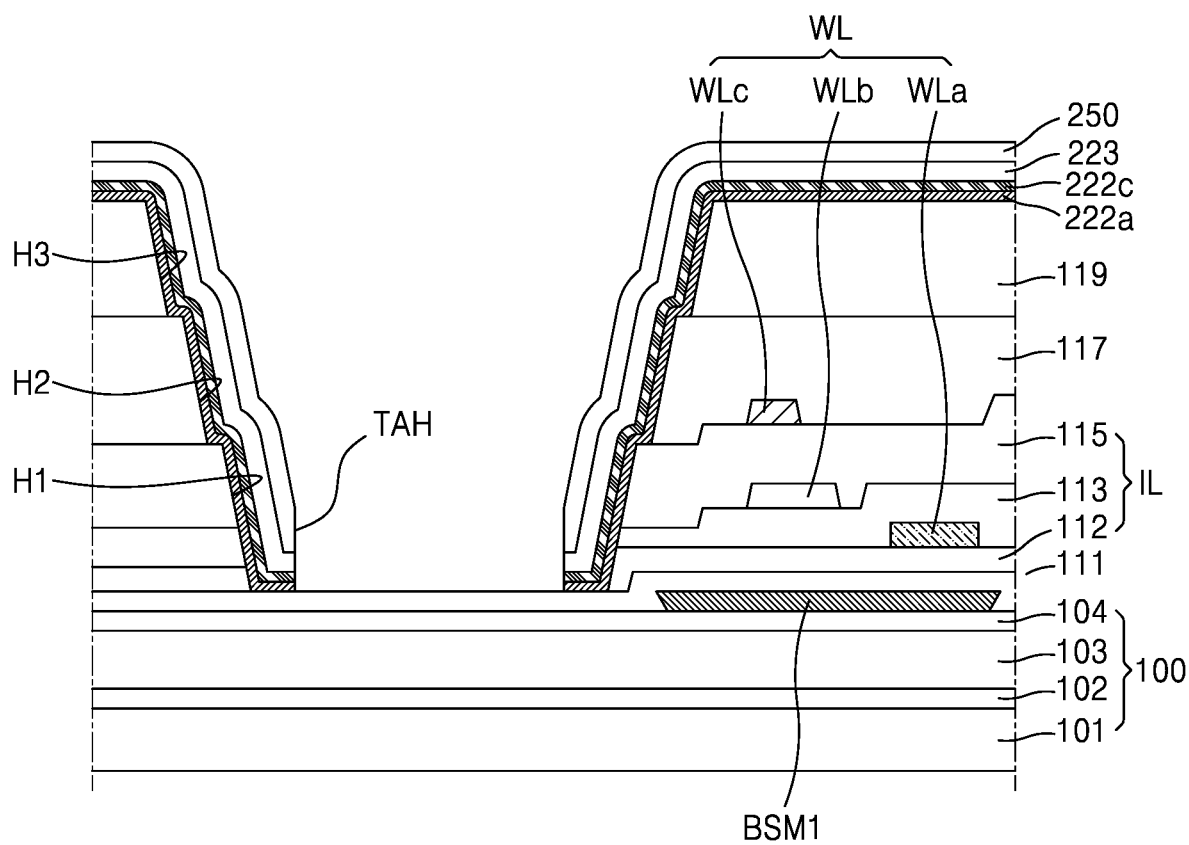

FIGS. 7A to 7C are cross-sectional views sequentially showing a method of manufacturing a display device, according to an embodiment. Specifically, FIGS. 7A to 7C show a method of forming the transmissive hole TAH.

Referring to FIG. 7B, a sacrifice-metal layer ML is formed inside the first hole H1 of the inorganic insulating layer IL.

The sacrifice-metal layer ML may include metal such as Ag, Al, Pt, Pd, Au, Ni, Mo, and Ti. Also, the sacrifice-metal layer ML may further include a layer including ITO, IZO, ZnO, or $In_2O_3$ on/under the metal material. According to some example embodiments, the sacrifice-metal layer ML may be simultaneously formed with the pixel electrodes, that is, the first pixel electrode 221 and the second pixel electrode 221' and may include the same material as those of the first pixel electrode 221 and the second pixel electrode 221'.

The first functional layer 222a, the second functional layer 222c, the opposite electrode 223, and the capping layer 250 are sequentially formed on the sacrifice-metal layer ML, the first functional layer 222a, the second functional layer 222c, the opposite electrode 223, and the capping layer 250 each being formed as one body in the display area DA and the sensor area SA.

Next, referring to FIG. 7B, laser light is irradiated on the sacrifice-metal layer ML arranged in the transmissive area TA, from a bottom surface of the substrate 100. That is, the laser light may progress in a z-direction from the bottom surface of the substrate 100 and may be irradiated on a bottom surface of the sacrifice-metal layer ML. The laser light may have an infrared wavelength. In the case where the laser light is infrared light, because a transmittance of the substrate 100 and the buffer layer 111 is 80% to 90% or more, the laser light LP may efficiently reach the sacrifice-metal layer ML.

Since the sacrifice-metal layer ML include an opaque metal, the sacrifice-metal layer ML may absorb the laser light. Therefore, thermal expansion occurs in the sacrifice-metal layer ML, and the sacrifice-metal layer ML on which the laser light LP has been irradiated may be lifted-off from the substrate 100 or the buffer layer 111.

Since a portion of the sacrifice-metal layer ML is lifted-off, the first functional layer 222a, the second functional layer 222c, the opposite electrode 223, and the capping layer 250 arranged on the sacrifice-metal layer ML may be removed together with the sacrifice-metal layer ML. Therefore, as shown in FIG. 7C, the transmissive hole TAH may be formed, the transmissive hole TAH including the openings of the first functional layer 222a, the second functional layer 222c, the opposite electrode 223, and the capping layer 250.

When laser light is irradiated in a (−) z-direction, which is a transmissive area direction, from above the substrate 100 so as to form the transmissive hole TAH, and the inorganic material layers, the organic material layer, the opposite electrode, etc. arranged in the transmissive area TA are removed, a laser-processed surface may be secondarily damaged by particles occurring during the removing process. In contrast, because the present embodiments use lift-off by thermal expansion of the sacrifice-metal layer ML, an issue of the damage by particles may not occur or may be reduced.

According to some example embodiments, the first metal layer BSM1 may be introduced so as to protect the wirings WL arranged on one side of the transmissive area TA from laser light. During a process of irradiating laser light on the sacrifice-metal layer ML, a light path of a portion of the laser light may be directed to the wirings WL.

According to some example embodiments, because the first metal layer BSM1 is introduced below the wirings WL to overlap the wirings WL, the first metal layer BSM1 may prevent the laser light from reaching the wirings WL.

Also, according to some example embodiments, a lateral surface of the first metal layer BSM1 has an inverse-tapered shape. For example, an angle θ formed by the top surface of the substrate 100 and the lateral surface of the first metal layer BSM1 may be about 70° to about 80°. Therefore, a light path LP of the laser light directed to the wirings WL may be reflected by the lateral surface having the inverse-tapered shape. This means that, though a width of the first metal layer BSM1 is not sufficiently large, the laser light may be prevented from reaching the wirings WL arranged thereabove. Therefore, a space occupied by the first metal layer BSM1 may be reduced.

Figure 8:
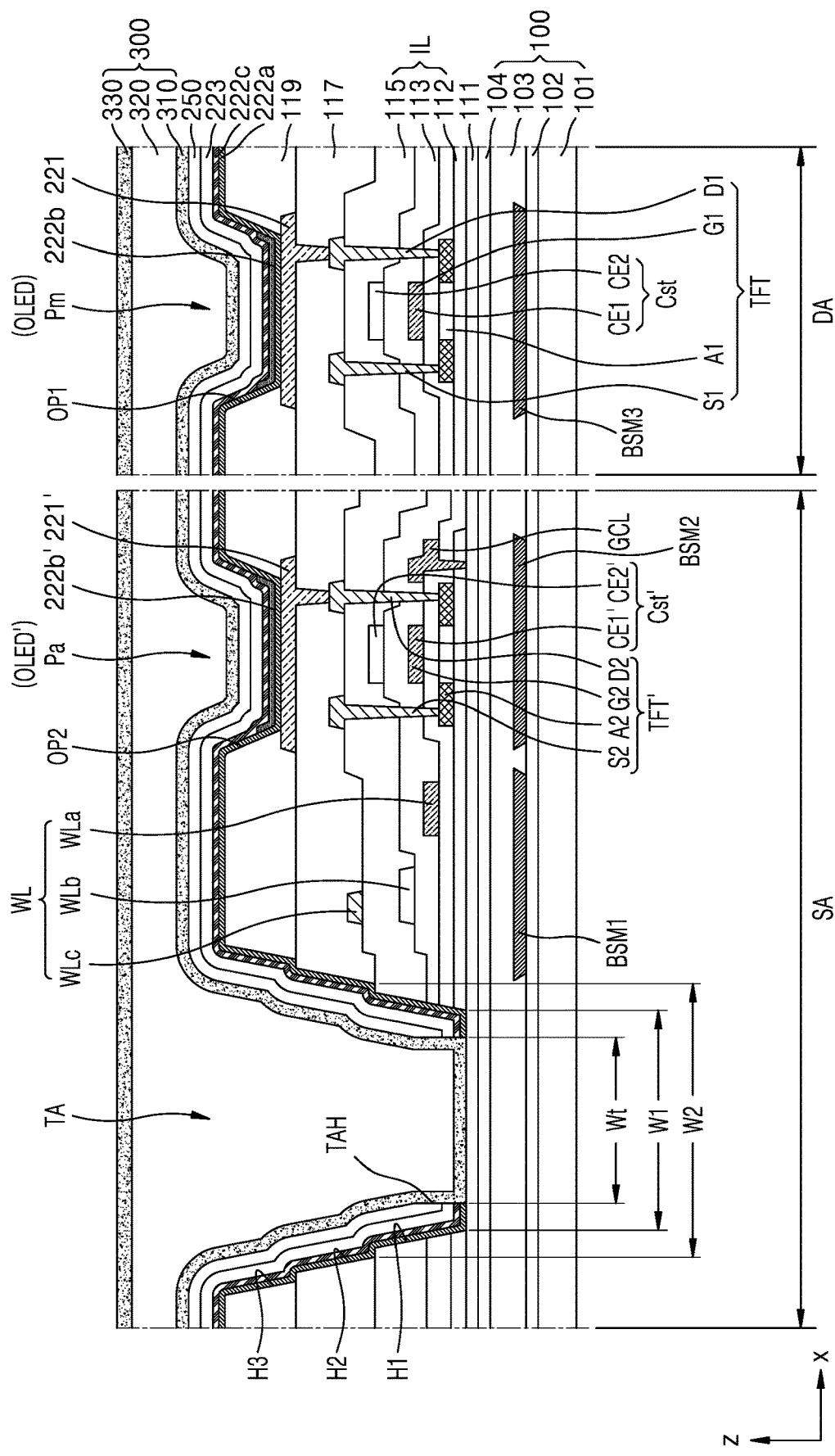
FIG. 8 is a cross-sectional view of a display device according to some example embodiments.

FIG. 8 is a cross-sectional view of a portion of a display device according to another embodiment. In FIG. 8, because the same reference numerals as those in FIG. 6 denote the same elements, some repeated description thereof may be omitted.

Referring to FIG. 8, the main pixel Pm is arranged in the display area DA, and the auxiliary pixel Pa and the transmissive area TA are arranged in the sensor area SA. Also, a plurality of wirings WL are arranged on one side of the transmissive area TA and between the transmissive area TA and the auxiliary pixel Pa.

The main pixel Pm may include the main thin film transistor TFT, the main storage capacitor Cst, and the main organic light-emitting diode OLED. The auxiliary pixel Pa may include the auxiliary thin film transistor TFT', the auxiliary storage capacitor Cst', and the auxiliary organic light-emitting diode OLED'. The transmissive area TA may include the transmissive hole TAH corresponding to the transmissive area TA.

The first metal layer BSM1 is arranged below the wirings WL arranged on one side of the transmissive area TA to overlap the wirings WL. According to some example embodiments, a lateral surface of the first metal layer BSM1 may have an inverse-tapered shape with respect to the top surface of the substrate 100.

Also, the second metal layer BSM2 may be arranged below the auxiliary thin film transistor TFT' of the auxiliary pixel Pa so as to overlap the auxiliary thin film transistor TFT'. The third metal layer BSM3 may be arranged below the main thin film transistor TFT of the main pixel Pm so as to overlap the main thin film transistor TFT. A lateral surface of the second metal layer BSM2 and/or the third metal layer BSM3 may have an inverse-tapered shape with respect to the top surface of the substrate 100.

The substrate 100 may include the first base layer 101, the first inorganic layer 102, the second base layer 103, and the second inorganic layer 104 that are stacked.

According to some example embodiments, the first metal layer BSM1 may be arranged between the first inorganic layer 102 and the second base layer 103. That is, the first metal layer BSM1 may be arranged on the first inorganic layer 102, and the second base layer 103 may cover the first metal layer BSM1. In this case, the second base layer 103 includes an organic material layer. A top surface of the second base layer 103 may be flat due to its characteristic. Also, layers arranged over the second base layer 103 may be less influenced by bending of the arrangement of the first metal layer BSM1.

Since the first metal layer BSM1 may be introduced so as to minimize the damage of the wirings WL by the irradiation of the laser light when forming the transmissive hole TAH, the first metal layer BSM1 may be arranged below the wirings WL and the location of the first metal layer BSM1 is not limited by the drawings.

For example, unlike the location shown in the drawings, the first metal layer BSM1 may be arranged below the first base layer 101, between the first base layer 101 and the first inorganic layer 102, or between the second base layer 103 and the second inorganic layer 104. Various modifications may be made.

Though it is shown in the drawings that the second metal layer BSM2 and the third metal layer BSM3 are arranged on the same layer on which the first metal layer BSM1 is arranged, the embodiments are not limited thereto. The second metal layer BSM2 and/or the third metal layer BSM3 may be arranged on various layers below the buffer layer 111, and may not be arranged on the same layer on which the first metal layer BSM1 is arranged.

Also, the second metal layer BSM2 and the third metal layer BSM3 may be omitted.

Figure 9:
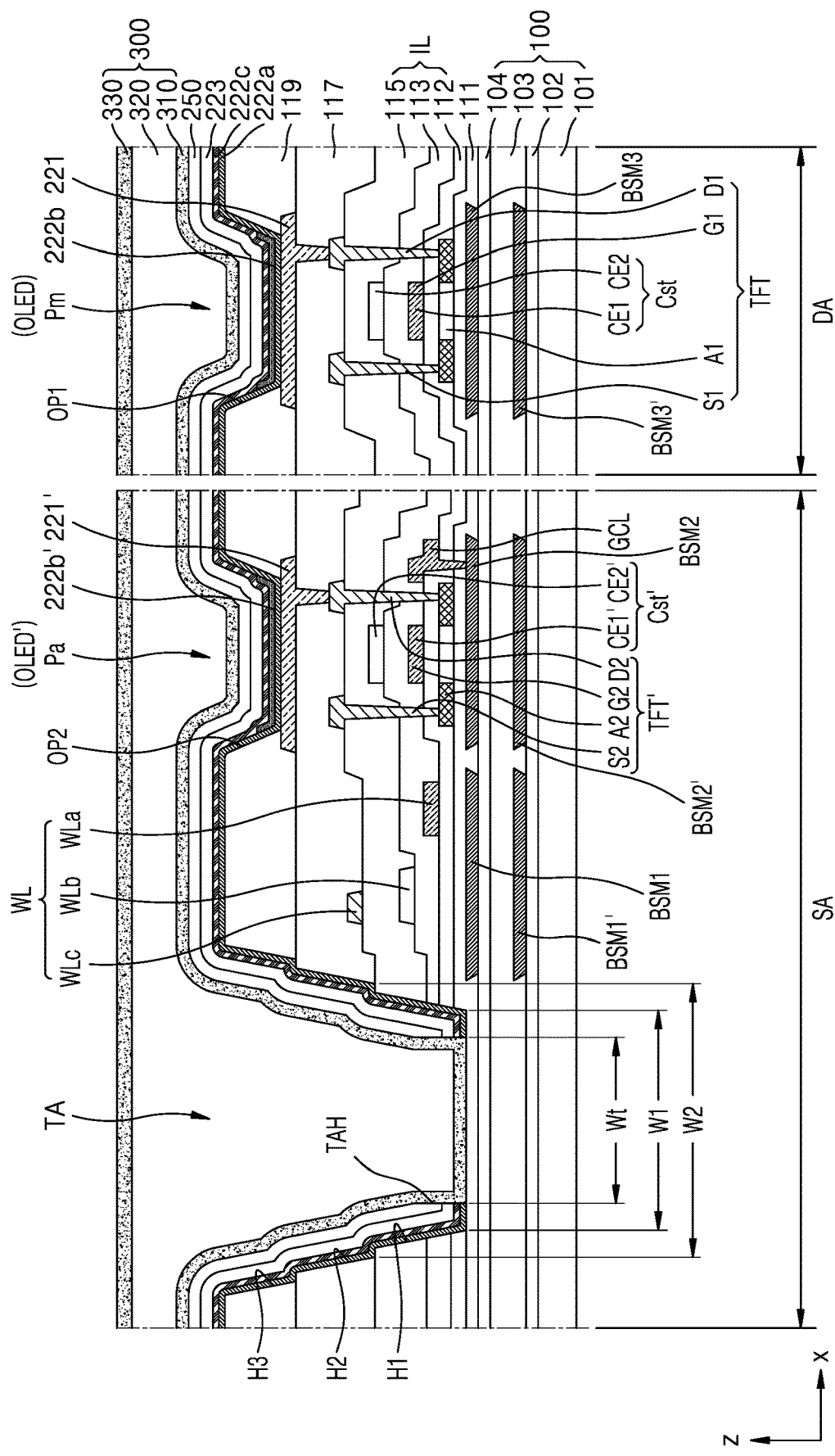
FIG. 9 is a cross-sectional view of a display device according to some example embodiments.

FIG. 9 is a cross-sectional view of a portion of a display device according to another embodiment. In FIG. 9, because the same reference numerals as those in FIG. 6 denote the same elements, some repeated description thereof may be omitted.

Referring to FIG. 9, the main pixel Pm is arranged in the display area DA, and the auxiliary pixel Pa and the transmissive area TA are arranged in the sensor area SA. Also, a plurality of wirings WL are arranged on one side of the transmissive area TA and between the transmissive area TA and the auxiliary pixel Pa.

The main pixel Pm may include the main thin film transistor TFT, the main storage capacitor Cst, and the main organic light-emitting diode OLED. The auxiliary pixel Pa may include the auxiliary thin film transistor TFT', the auxiliary storage capacitor Cst', and the auxiliary organic light-emitting diode OLED'. The transmissive area TA may include the transmissive hole TAH corresponding to the transmissive area TA.

The first metal layer BSM1 is arranged below the wirings WL arranged on one side of the transmissive area TA so as to overlap the wirings WL. According to some example embodiments, a lateral surface of the first metal layer BSM1 may have an inverse-tapered shape with respect to the top surface of the substrate 100.

Also, the second metal layer BSM2 may be arranged below the auxiliary thin film transistor TFT' of the auxiliary pixel Pa so as to overlap the auxiliary thin film transistor TFT'. The third metal layer BSM3 may be arranged below the main thin film transistor TFT of the main pixel Pm so as to overlap the main thin film transistor TFT. A lateral surface of the second metal layer BSM2 and/or the third metal layer BSM3 may have an inverse-tapered shape with respect to the top surface of the substrate 100.

The substrate 100 may include the first base layer 101, the first inorganic layer 102, the second base layer 103, and the second inorganic layer 104 that are stacked.

A display device according to some example embodiments may further include a first additional metal layer BSM1' arranged with the first metal layer BSM1 and an insulating layer therebetween, the first additional metal layer BSM1' overlapping the first metal layer BSM1 and the insulating layer. The first additional metal layer BSM1' may be arranged under the first base layer 101, between the first base layer 101 and the first inorganic layer 102, between the first inorganic layer 102 and the second base layer 103, between the second base layer 103 and the second inorganic layer 104, or on the second inorganic layer 104. Since the first additional metal layer BSM1' is arranged, heat diffusion by laser light may be more efficiently blocked.

A second additional metal layer BSM2' may be arranged below the second metal layer BSM2, and a third additional metal layer BSM3' may be arranged below the third metal layer BSM3. The first to third additional metal layers BSM1', BSM2', and BSM3' may be electrically floated and may receive a constant voltage or an electric signal.

Figure 10:
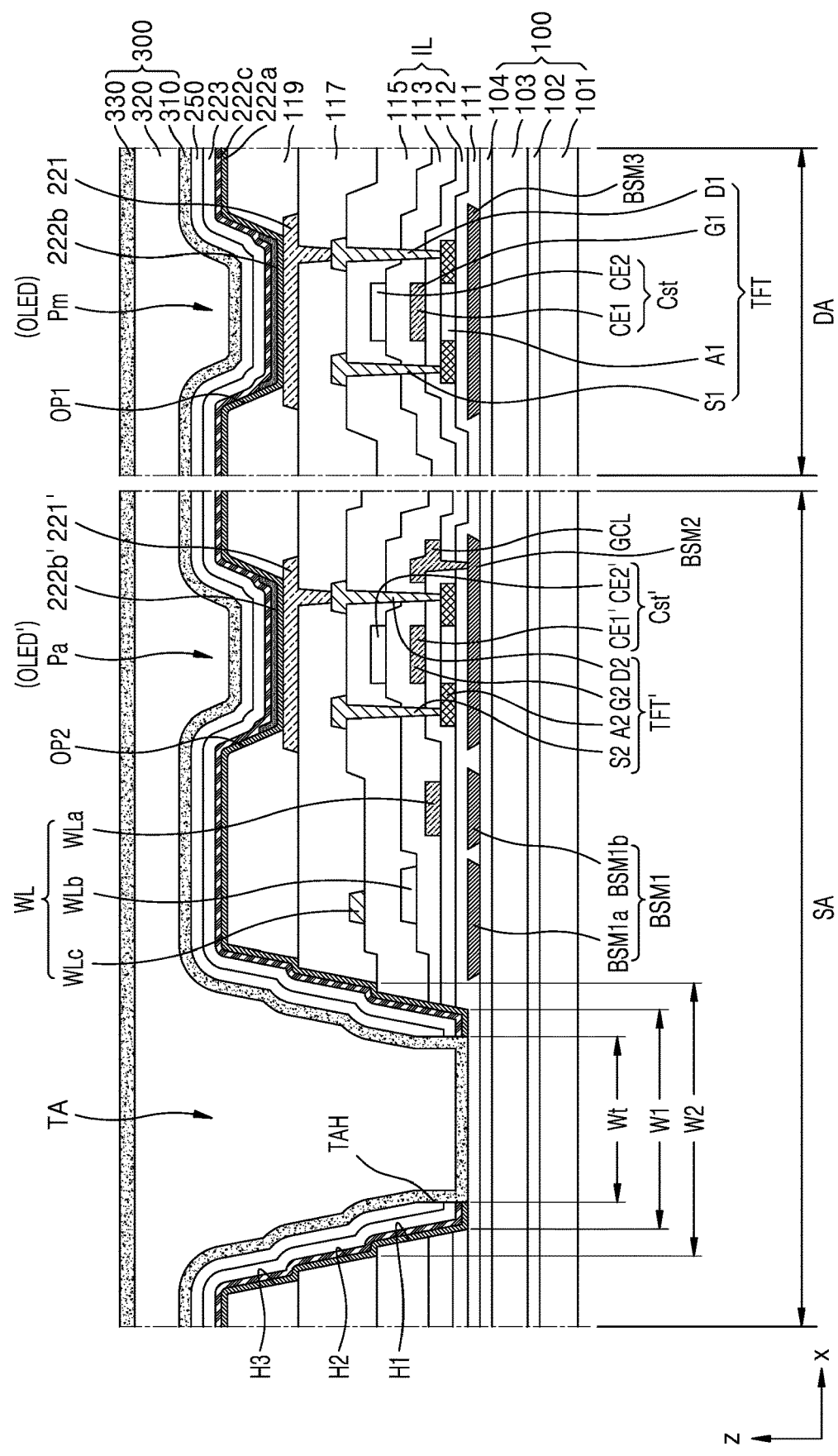
FIG. 10 is a cross-sectional view of a display device according to some example embodiments.

FIG. 10 is a cross-sectional view of a portion of a display device according to another embodiment. In FIG. 10, because the same reference numerals as those in FIG. 6 denote the same elements, some repeated description thereof may be omitted.

Referring to FIG. 10, the main pixel Pm is arranged in the display area DA, and the auxiliary pixel Pa and the transmissive area TA are arranged in the sensor area SA. Also, a plurality of wirings WL are arranged on one side of the transmissive area TA and between the transmissive area TA and the auxiliary pixel Pa.

The main pixel Pm may include the main thin film transistor TFT, the main storage capacitor Cst, and the main organic light-emitting diode OLED. The auxiliary pixel Pa may include the auxiliary thin film transistor TFT', the auxiliary storage capacitor Cst', and the auxiliary organic light-emitting diode OLED'. The transmissive area TA may include the transmissive hole TAH corresponding to the transmissive area TA.

The wirings WL arranged on one side of the transmissive area TA may include a first wiring WLa and a second wiring WLb that do not overlap each other. In this case, the first metal layer BSM1 may include a first sub-metal layer BSM1a and a second sub-metal layer BSM1b that are apart from each other.

The first sub-metal layer BSM1a may overlap the first wiring WLa, and the second sub-metal layer BSM1b may overlap the second wiring WLb. A lateral surface of the first sub-metal layer BSM1a and the second sub-metal layer BSM1b may have an inverse-tapered shape with respect to the top surface of the substrate 100.

Figure 11:
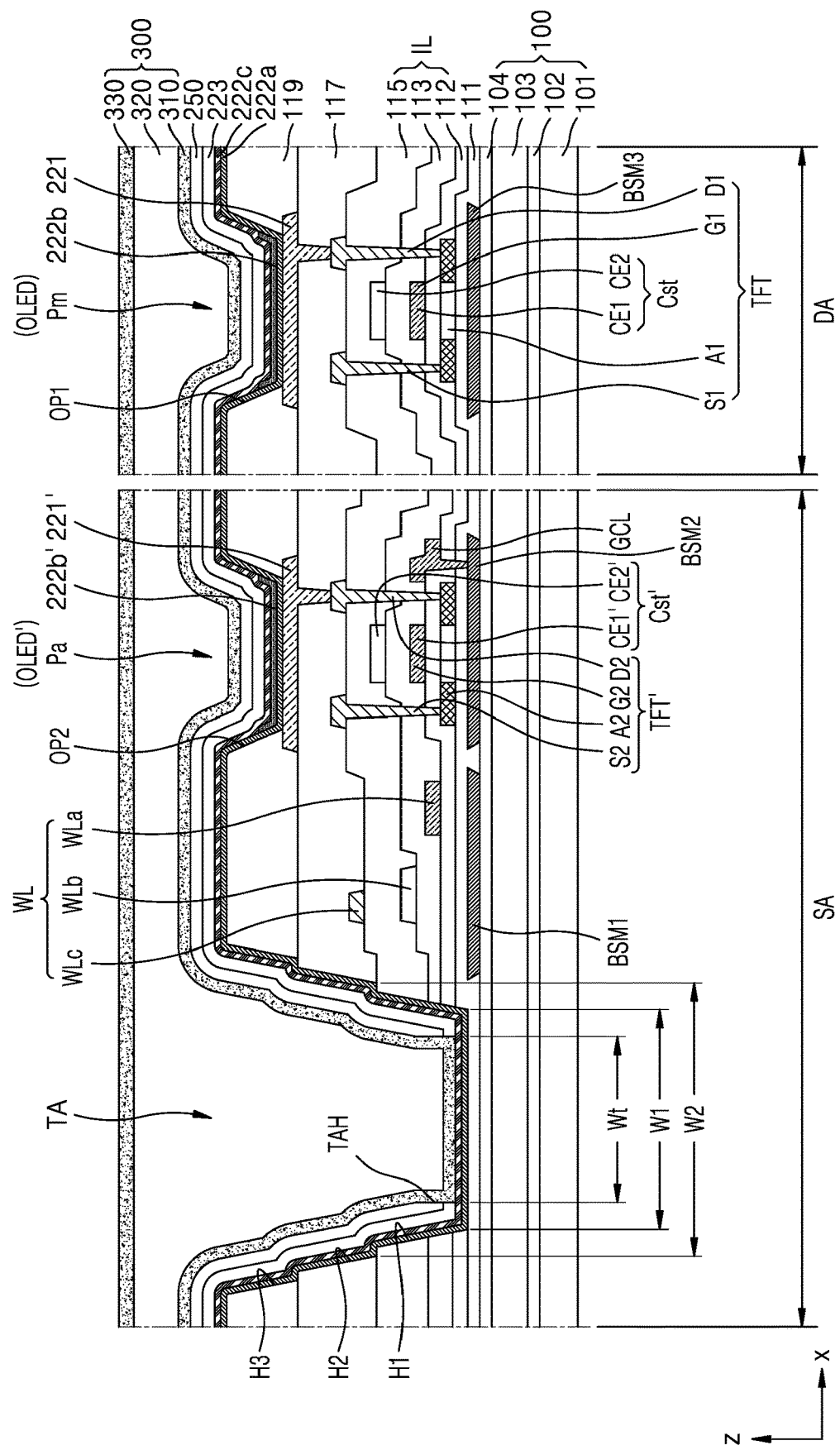
FIG. 11 is a cross-sectional view of a display device according to some example embodiments.

FIG. 11 is a cross-sectional view of a portion of a display device according to another embodiment. In FIG. 11, because the same reference numerals as those in FIG. 6 denote the same elements, some repeated description thereof may be omitted.

Referring to FIG. 11, the main pixel Pm is arranged in the display area DA, and the auxiliary pixel Pa and the transmissive area TA are arranged in the sensor area SA. Also, a plurality of wirings WL are arranged on one side of the transmissive area TA and between the transmissive area TA and the auxiliary pixel Pa.

The main pixel Pm may include the main thin film transistor TFT, the main storage capacitor Cst, and the main organic light-emitting diode OLED. The auxiliary pixel Pa may include the auxiliary thin film transistor TFT', the auxiliary storage capacitor Cst', and the auxiliary organic light-emitting diode OLED'. The transmissive area TA may include the transmissive hole TAH corresponding to the transmissive area TA.

The first metal layer BSM1 is arranged below the wirings WL arranged on one side of the transmissive area TA to overlap the wirings WL. According to some example embodiments, a lateral surface of the first metal layer BSM1 may have an inverse-tapered shape with respect to the top surface of the substrate 100.

Also, the second metal layer BSM2 may be arranged below the auxiliary thin film transistor TFT' of the auxiliary pixel Pa to overlap the auxiliary thin film transistor TFT'. The third metal layer BSM3 may be arranged below the main thin film transistor TFT of the main pixel Pm to overlap the main thin film transistor TFT. A lateral surface of the second metal layer BSM2 and/or the third metal layer BSM3 may have an inverse-tapered shape with respect to the top surface of the substrate 100.

According to some example embodiments, the first functional layer 222*a* and/or the second functional layer 222*c* may be arranged in a region of the transmissive hole TAH. That is, the first functional layer 222*a* and/or the second functional layer 222*c* may extend from the display area DA and the sensor area SA to correspond to the transmissive hole TAH.

Such a structure may be implemented in the case where the sacrifice-metal layer ML (see FIG. 7A) is not used when forming the transmissive hole TAH, or in the case where the sacrifice-metal layer ML is arranged on the first functional layer 222*a* and/or the second functional layer 222*c*.

In the case where laser light is irradiated from the bottom surface of the substrate 100, because a region of the sacrifice-metal layer ML or the opposite electrode 223 on which the laser light is irradiated is lifted-off, the transmissive hole TAH is formed while layers thereon are removed.

Therefore, in the case where the sacrifice-metal layer ML is not arranged under the first functional layer 222*a* and/or the second functional layer 222*c*, there may be the first functional layer 222*a* and/or the second functional layer 222*c* corresponding to the transmissive hole TAH.

In a display device according to some example embodiments, because a pixel area and a transmissive area having an improved light transmittance are arranged in the sensor area corresponding to a component such as a sensor, an environment under which the component may operate may be secured, and simultaneously, an image may be displayed in an area overlapping the component.

Therefore, a display device having various functions and simultaneously improving a quality may be provided. However, these effects are provided as an example and effects according to embodiments are described in detail through following description.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display device comprising:
   a substrate on which a plurality of pixels and a transmissive area are located, each of the plurality of pixels including a display element;
   a plurality of wirings on the substrate, the wirings being on one side of the transmissive area in a plan view and including a first wiring, a second wiring, and a third wiring, the second wiring being on a first layer that is on the first wiring, and the third wiring overlapping the second wiring and being on a second layer that is on the second wiring;
   a pixel electrode and an emission layer included in the display element;
   an opposite electrode on the emission layer and including an opening corresponding to the transmissive area; and
   a first metal layer overlapping the first wiring and the second wiring, the first metal layer being below the first wiring and the second wiring,
   wherein a lateral surface of the first metal layer has an inverse-tapered shape with respect to a top surface of the substrate,
   wherein the transmissive area is an area capable of transmitting light or signals,
   wherein the transmissive area is at least partially surrounded by the plurality of pixels, and
   wherein the first metal layer is not in contact with the wirings.

2. The display device of claim 1, further comprising:
   a buffer layer over the substrate,
   wherein each of the plurality of pixels includes a thin film transistor on the buffer layer, and
   the first metal layer is between the substrate and the buffer layer.

3. The display device of claim 1, wherein
   the substrate includes a first base layer, a first inorganic layer, a second base layer, and a second inorganic layer that are sequentially stacked.

4. The display device of claim 3, wherein
   the first metal layer is under the first base layer, between the first base layer and the first inorganic layer, between the first inorganic layer and the second base layer, between the second base layer and the second inorganic layer, or on the second inorganic layer.

5. The display device of claim 4, wherein the first additional metal layer is under the first base layer, between the first base layer and the first inorganic layer, between the first inorganic layer and the second base layer, between the second base layer and the second inorganic layer, or on the second inorganic layer.

6. The display device of claim 1, wherein the first wiring and the second wiring do not overlap each other, and
   the first metal layer includes a first sub-metal layer and a second sub-metal layer, the first sub-metal layer overlapping the first wiring, and the second sub-metal layer overlapping the second wiring.

7. The display device of claim 1, further comprising:
a second metal layer below the each of the plurality of pixels.
8. The display device of claim 7, wherein
a lateral surface of the second metal layer has an inverse-tapered shape.
9. The display device of claim 1, further comprising:
a functional layer between the pixel electrode and the emission layer, or between the emission layer and the opposite electrode,
wherein a same material as that of the functional layer is in the transmissive area.
10. The display device of claim 1, further comprising:
an inorganic insulating layer over the substrate,
wherein the inorganic insulating layer includes a first hole corresponding to the transmissive area, and
the opposite electrode is on a lateral wall of the first hole.

* * * * *

UNITED STATES PATENT AND TRADEMARK OFFICE
CERTIFICATE OF CORRECTION

PATENT NO. : 12,356,807 B2
APPLICATION NO. : 16/842313
DATED : July 8, 2025
INVENTOR(S) : Woosik Jeon et al.

Page 1 of 1

It is certified that error appears in the above-identified patent and that said Letters Patent is hereby corrected as shown below:

In the Claims

In Column 26, Lines 56-57, in Claim 5, after "first" delete "additional".

Signed and Sealed this
Fourth Day of November, 2025

John A. Squires
*Director of the United States Patent and Trademark Office*